United States Patent [19]

Woodman, Jr.

[11] 4,293,999
[45] Oct. 13, 1981

[54] RADIAL LEAD INSERTING MACHINE

[75] Inventor: Daniel W. Woodman, Jr., Beverly, Mass.

[73] Assignee: USM Corporation, Farmington, Conn.

[21] Appl. No.: 956,436

[22] Filed: Oct. 31, 1978

[51] Int. Cl.³ .............................................. H05K 3/32
[52] U.S. Cl. .................................. 29/564.6; 29/566.2; 29/741
[58] Field of Search .................. 29/564.68, 564, 564.1, 29/33 M, 566.3, 566.2, 741, 740, 739, 863, 827

[56] References Cited

U.S. PATENT DOCUMENTS

| | | | |
|---|---|---|---|
| 2,896,213 | 7/1959 | Alderman et al. | 29/566.3 |
| 3,594,889 | 7/1971 | Clark | 29/741 X |
| 3,597,824 | 8/1971 | Yoshida | 29/564.6 |
| 3,636,624 | 1/1972 | Bates | 29/626 |
| 3,777,350 | 12/1978 | Maeda | 29/564.6 X |
| 3,783,488 | 1/1974 | Ragard | 29/566 |
| 4,043,032 | 8/1977 | Spangler | 29/628 |
| 4,051,593 | 10/1977 | Mori | 29/564.6 |
| 4,054,988 | 10/1977 | Masuzima | 29/564.6 |
| 4,196,513 | 4/1980 | Harigane | 29/741 |

FOREIGN PATENT DOCUMENTS 571943  9/1977  U.S.S.R. ............................ 29/739

Primary Examiner—William R. Briggs
Attorney, Agent, or Firm—Owen J. Meegan; Carl E. Johnson

[57] ABSTRACT

Endwise insertion of leads projecting generally radially, or substantially in parallel, from one side of each of a plurality of interconnected electrical components is effected in rapid reliable succession. The components are sequentially fed into the head of a machine by a tape indexing mechanism. There, when aligned with a reciprocable inserter, the leads of each component after being cut to predetermined length are separated from the tape by spaced members acting transversely on the progressively guided tape. The lead cutting and their separation from the tape with the aid of lead grippers controlling the attitude of each component are effected substantially in alignment with insertion mechanism of the head operable cyclically on the successive components to effect their axial insertion; accordingly the arrangement provides a high-speed inserting cycle during which a reciprocable driver, acting through ball transfer means, actuates a component pusher, lead gripping fingers, and knives whereby each lead is continuously controlled as to its shape and position.

Although herein illustrated for use at a conveyorized station of component assembling apparatus and hence adapted with but a single channel for supplying similar components, the machine, with minor modification, is also useful with multi-channel component feeding arrangements.

19 Claims, 26 Drawing Figures

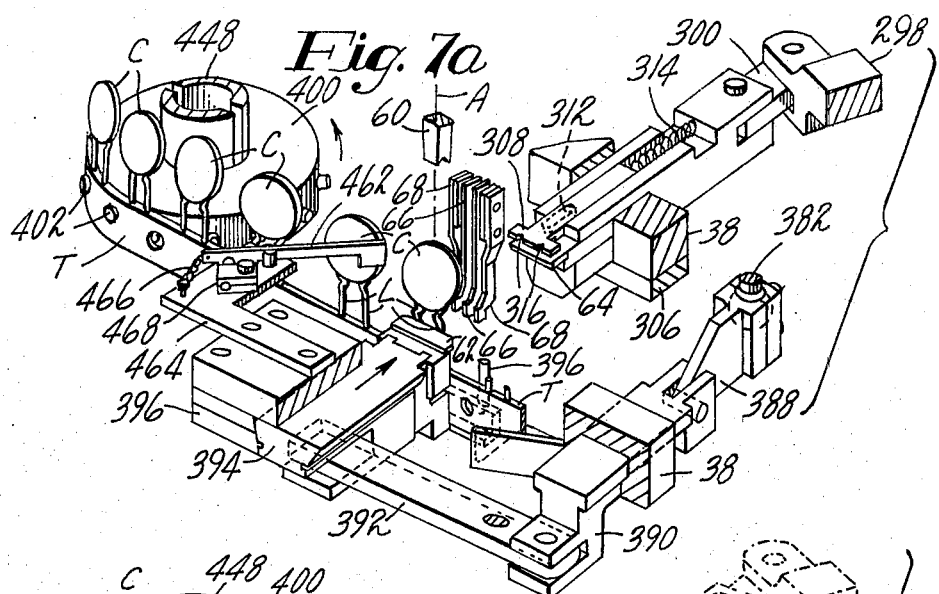
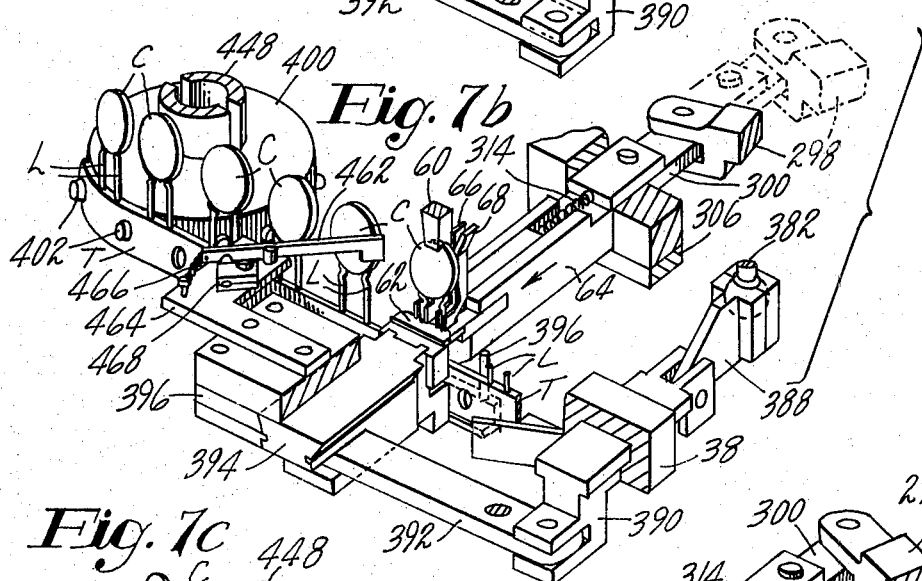
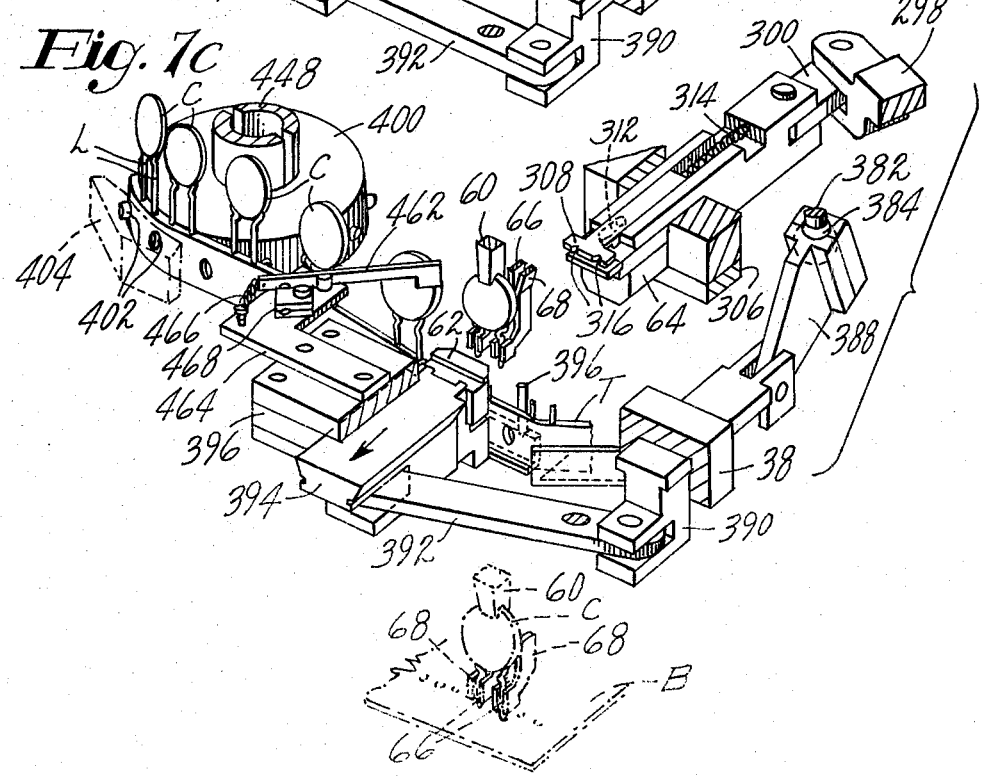

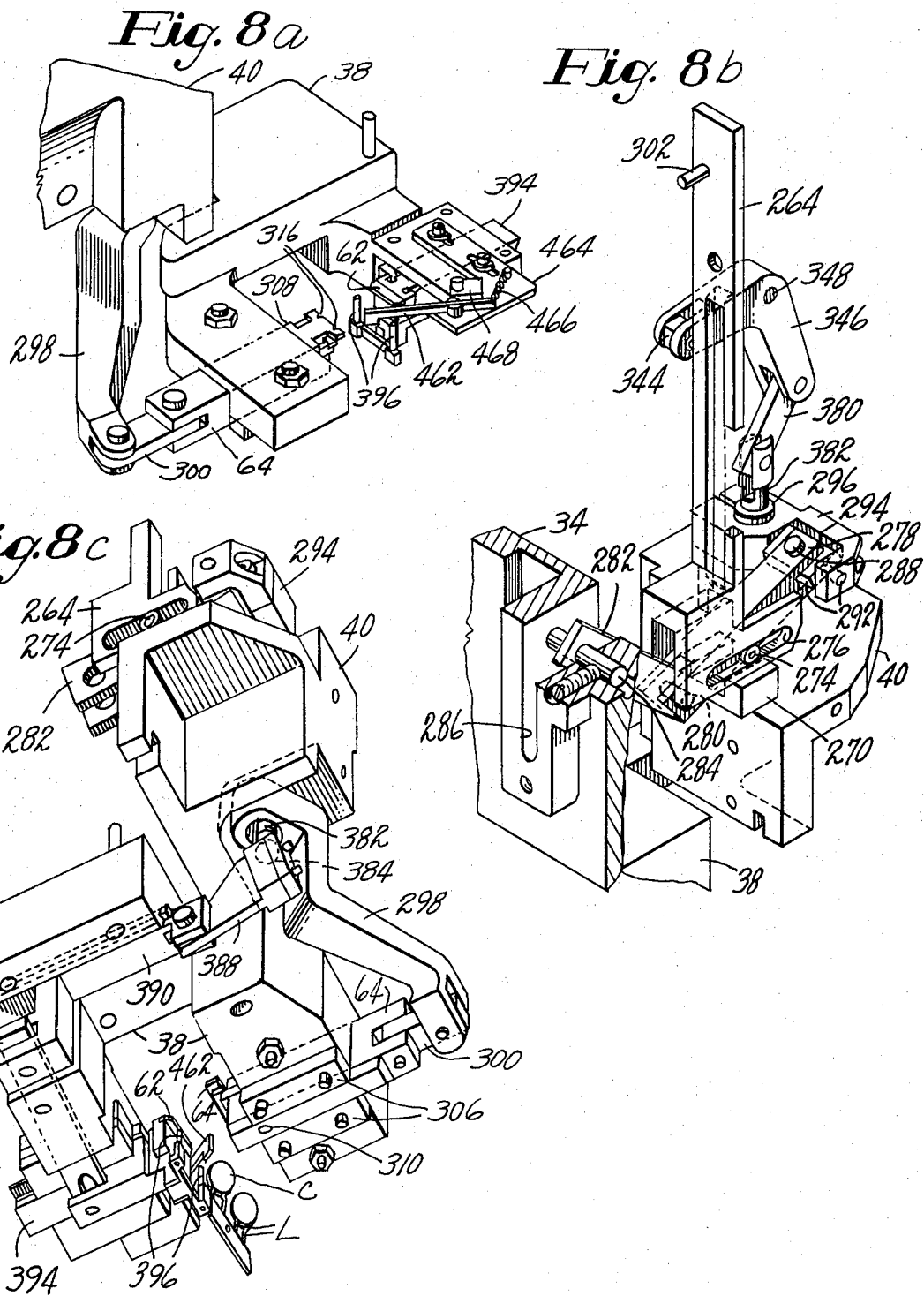

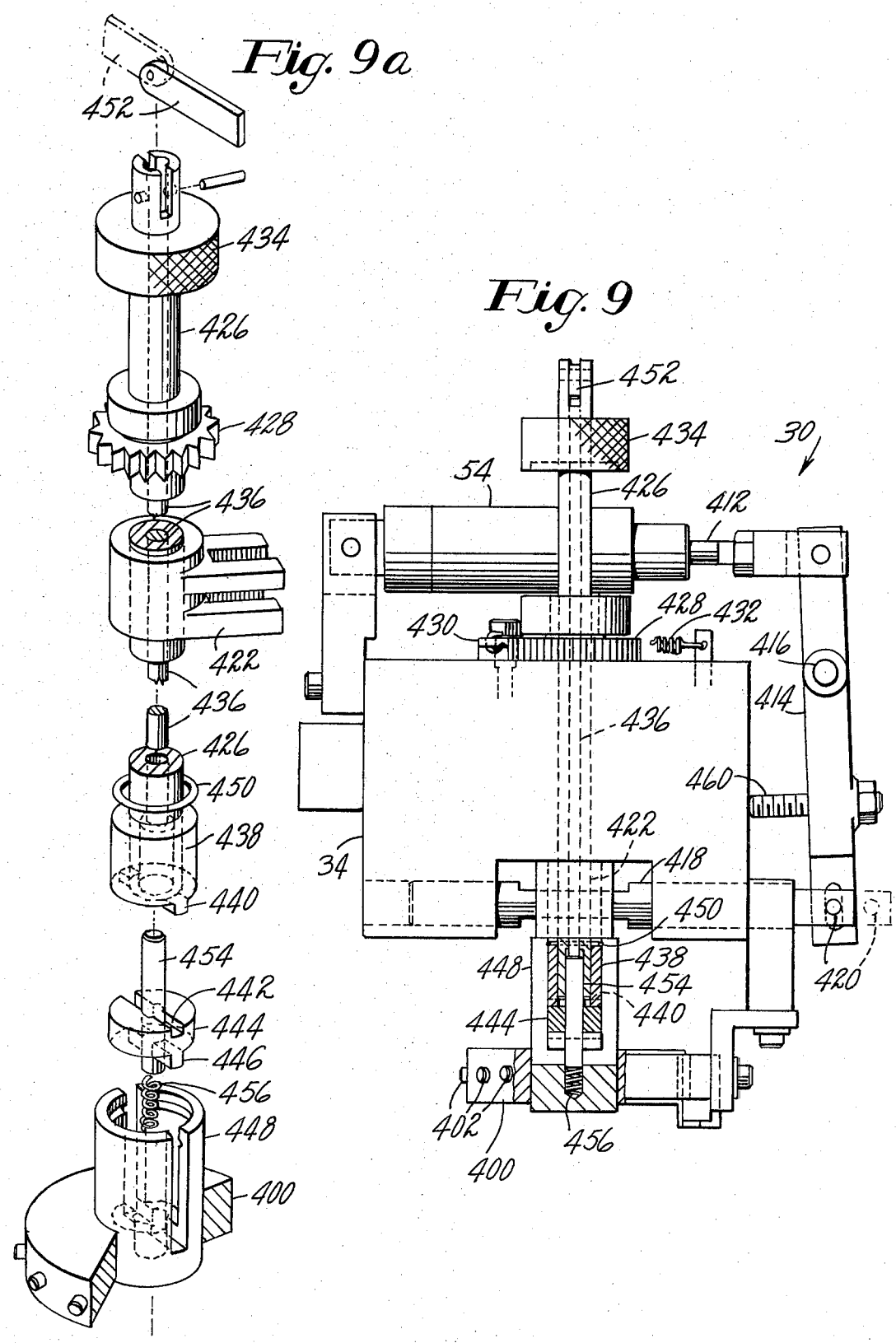

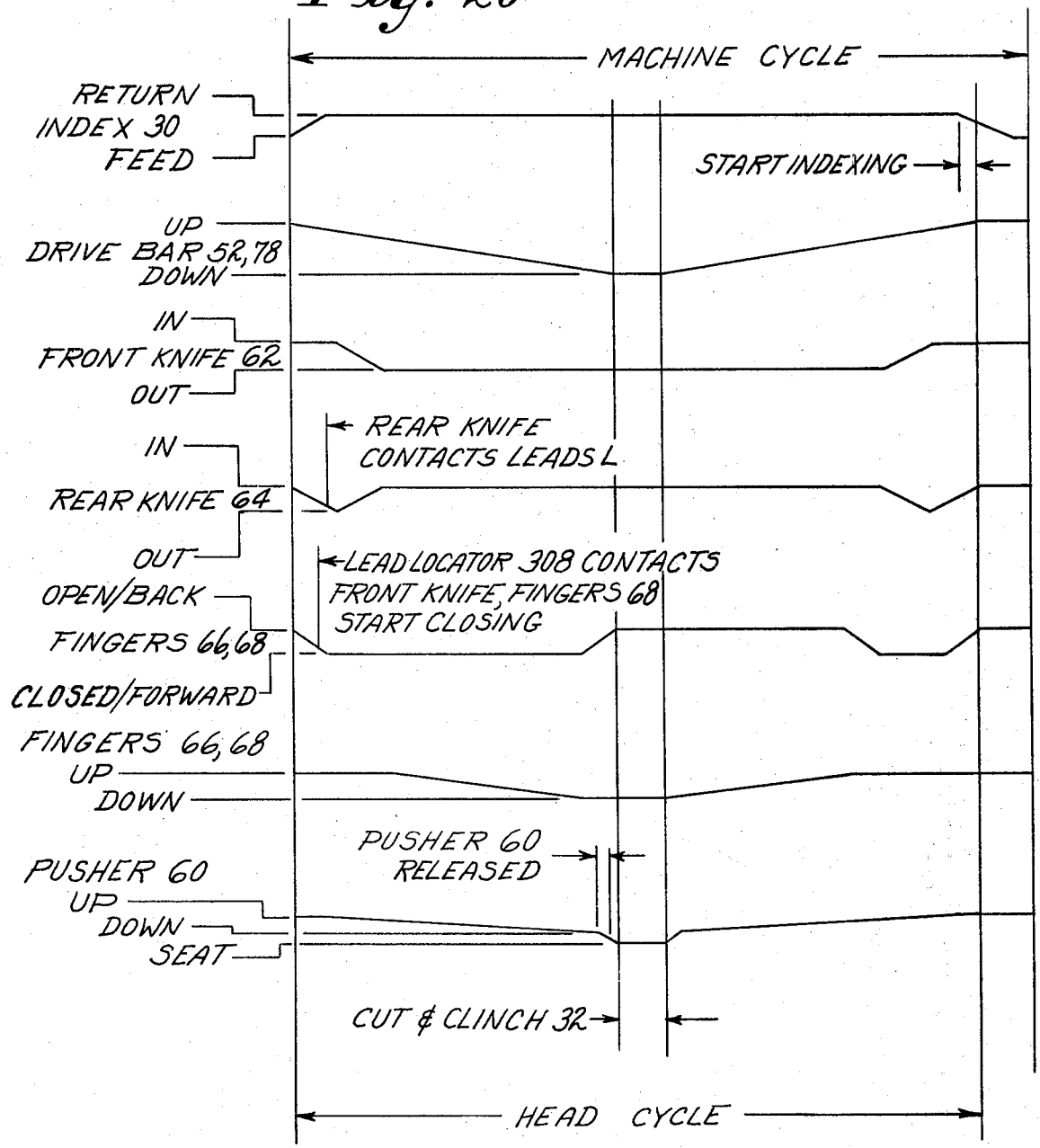

RADIAL LEAD INSERTING MACHINE

CROSS-REFERENCE TO RELATED APPLICATION

An application for U.S. patent Ser. No. 942,286, was filed Sept. 14, 1978, in the name of Stanley Vancelette relating to a cut-clinch mechanism useable with this invention.

BACKGROUND OF THE INVENTION

This invention relates to component inserting machines, and more particularly to such machines capable of inserting multiple parallel (or so-called "radial") leads projecting from electrical components into the preformed holes of circuit boards or the like.

One approach to dealing with radial lead type components has been to reform them with coaxial lead portions and apply an interconnecting feed tape to those portions whereby they can then be advanced to appropriately spaced lead cutting and inserting members. U.S. Pat. Nos. 4,003,413; 3,942,701 and 3,971,193 for instance, are concerned with such techniques. Since that method requires the usage of extra circuit board space to accommodate projection of the leads beyond the outline of their component body, and may entail complex or cumbersome sequencing and insertion means without invariably attaining reliable performance, other approaches to the problem have been sought.

It is also widely known to sequentially advance radial lead type components as by fed tape to a means for separating each component from the tape and then causing a cyclically operable member to thrust the leads of each separated component into the lead-receiving holes of a board. Examples of such machines are disclosed, for example, in U.S. Pat. Nos. 2,896,213; 3,597,824; 3,636,624 and 4,051,593. With less lead preforming required, such relatively straightforward mechanical approach appears to be easy to accomplish mechanically, and it would be were it not for two primary factors: (1) the leads are at times irregularly spaced and/or unstraight despite the use of feed tape, and (2) the electronics assembly industry requires a very high insertion rate together with a very low number of misinsertions. Misinsertions mean costly production time lost and usually unacceptable waste.

SUMMARY OF THE INVENTION

In view of the foregoing, it is a primary object of this invention to provide an improved, high speed machine for inserting radial lead type electrical components, the machine to include reliable mechanism for continuously controlling the feeding, trimming and exact positioning of the individual leads of the successive components until insertion is effected.

A further object of the invention is to attain, in a component lead cutting and inserting machine, the speed and cost advantages of ball transfer actuating mechanism when driven from a single source yet affording dwells critical to reliable completion of each inserting cycle.

Another and more restricted object of this invention is to provide, in combination with an indexable system for tape feeding of radial lead type components successively into alignment with the operating instrumentalities of a cyclically operable inserting head, effective means for cutting the individual components from the tape and accurately controlling their cut leads for endwise threading into the preformed holes in a circuit board or the like, these means being powered from a single energy source.

To these and other ends the invention comprises as herein shown the provision, in combination with an indexing mechanism for positioning successive pairs of tape-fed component leads in relation to a component inserting head having a housing adjustable heightwise and rotatable about an inserting axis, instrumentalities therein including fingers closeable to seize each lead of the indexed component, cooperative knives to cut the seized leads simultaneously, and an inserting member engageable with the component and cooperative with the fingers to guide and thread the leads endwise through their lead-receiving holes. As herein illustrated the invention is preferably embodied in a fluid pressure operated machine wherein, in lieu of employing rotary cams which necessitate excessive size and undue mass for fast operation, ball transfer mechanism is provided for appropriately actuating the several instrumentalities rapidly and in sequential time relation within each cycle of the machine. The invention further contemplates, for optimum versatility in dealing rapidly with different components to be mounted and with different lead spacing, pneumatically actuated linkage for operating an inserting head and its associated parts, and another pneumatically operable system for controlling automatic indexing of successive tape-carried components relative to an inserting axis of the head.

BRIEF DESCRIPTION OF THE DRAWINGS

The foregoing and other features of the invention, together with novel details and combinations of parts, will now be more particularly described in connection with an illustrative embodiment and with reference to the accompanying drawings thereof, in which:

FIG. 1 is a perspective view of an illustrative machine for inserting radial lead type electronic components into preformed holes in circuit boards or the like;

FIGS. 7A, B and C are schematic perspective views of parts shown in FIGS. 3-6 inclusive, taken at successive stages of the insertion;

FIGS. 8A and 8B are perspective views of associated lead locating and knife moving parts shown in FIG. 3 but on a larger scale and looking down upon them, whereas FIG. 8C is a perspective view looking upwardly from beneath the parts shown in FIGS. 8A and 8B;

FIG. 9 is a view in side elevation, enlarged, of the indexing component feed means shown in FIG. 2;

FIG. 9A is an exploded perspective view of parts shown in FIG. 9;

FIG. 15a is an enlarged perspective view of release pin mechanism shown in FIG. 15;

FIG. 20 is a sequence chart for an operating cycle of the machine.

DESCRIPTION OF THE PREFERRED EMBODIMENT

Figure 1:
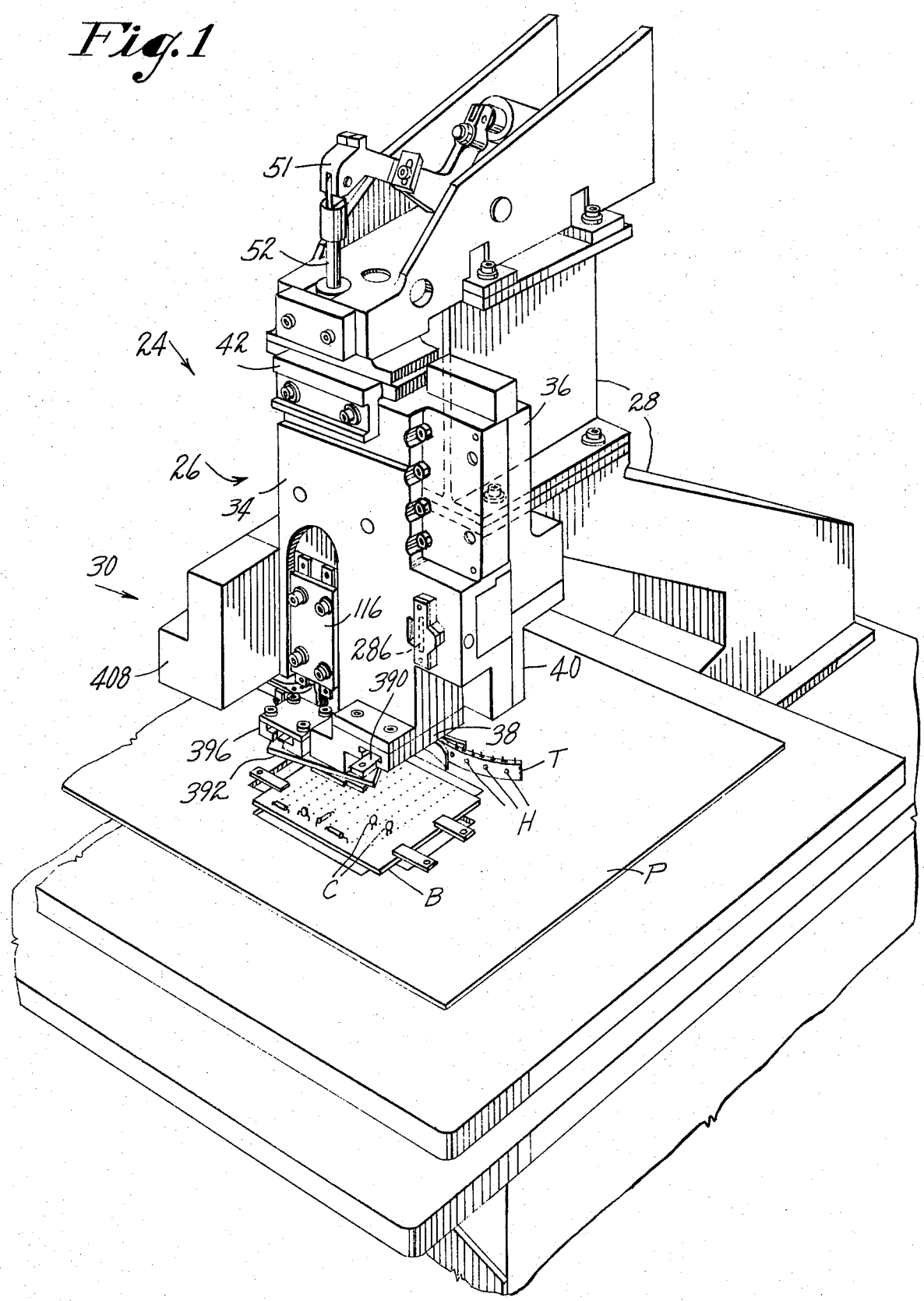
Figure 2:
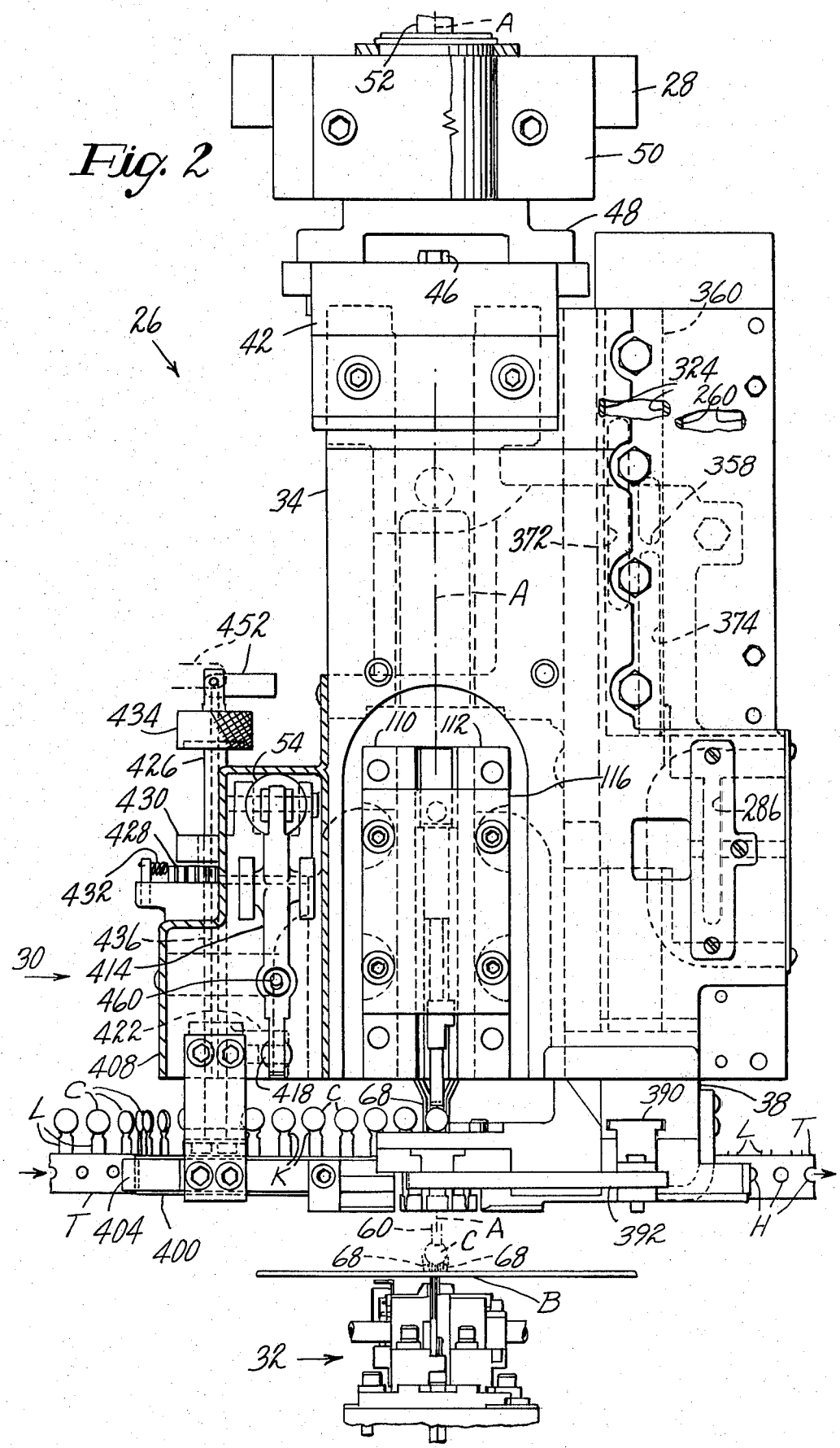
FIG. 2 is a view in front elevation on a larger scale of the machine shown in FIG. 1 with portions broken away and showing taped components to be indexed with respect to lead-controlling fingers and operating instrumentalities of the inserting head, and one component inserted.

Referring first to FIGS. 1 and 2, a component inserting machine generally designated 24 comprises an inserting head 26 supported on a composite frame 28. The head overlies a circuit board B which is formed with holes (not shown) spaced to receive the leads L of electrical components C. It will be understood that the machine 24 is particularly well adapted for insertion through the board of pairs of radial leads, i.e. leads L which extend substantially in parallel from one side of a component body. Shape of the body itself is of no particular significance, though by way of example in FIG. 2 they are shown circular and disc-like. The board B may be prepositioned manually relative to the head, or by pallet and conveyor, or other supporting means such as a cross-slide mechanism for receiving each component lead pair in succession. For convenience a board supporting pallet P is indicated in FIG. 1.

The machine 24 is designed to accommodate components with variable spacing of their radial leads L, for instance in the range of 0.100" to 0.400". As shown herein the components are fed from a supply source with their leads vertical as they are successively advanced by an indexing means 30 (FIGS. 2,3,7) controlling a continuous length of uniformly spaced holes H in pre-punched tape T by which the components C are carried with substantially uniform, fixed spacing. The illustrative organization hereinafter to be more fully described is such that the tape positions each component to be inserted in alignment with the common axis A (FIGS. 2,15,16) of a vertically reciprocable inserting mechanism and of a cut-clinch mechanism 32 (FIG. 2), for instance of the type disclosed in the pending patent application above cited.

Figure 3:
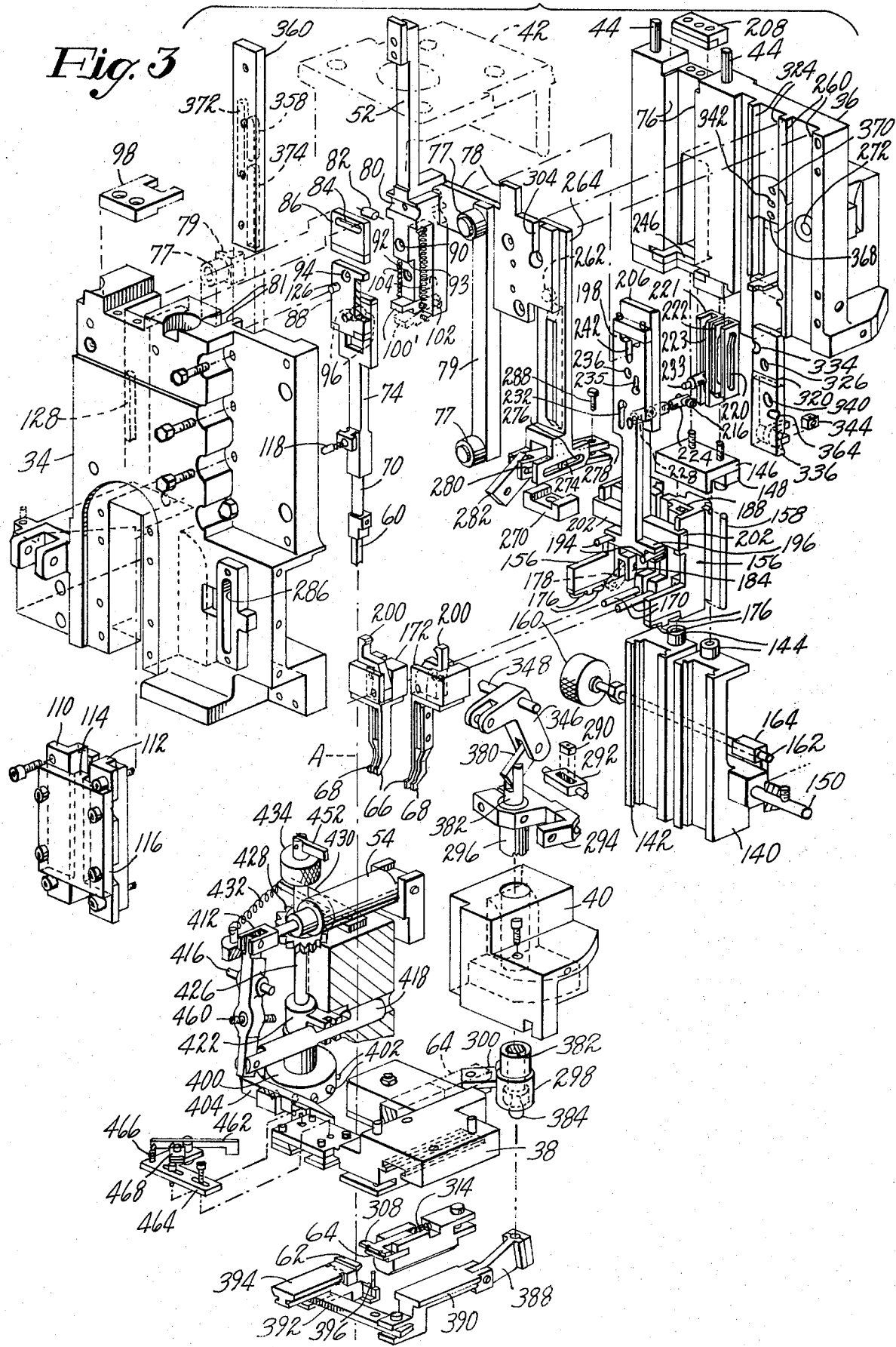
FIG. 3 is an exploded perspective view of component indexing means and the operating instrumentalities of the head, in relation to ball transfer mechanism, and portions of the head housing.

The head 26 comprises a four-part housing assembly, a front housing block 34 (FIGS. 1-3), a rear housing block 36, best seen in FIG. 3, a support 38 for lead cutting means later described, and a housing corner 40. A U-shaped upper member 42 is secured to the tops of the blocks 34,36 as by guide pins 44. For adjusting the housing assembly heightwise a screw 46 extends through a bore in the member 42 and is threaded into the block 36. Mounted on the member 42 is a support 48 (FIG. 2) having a cylindrical upper portion rotatably received in a holder 50 carried by the frame 28 and permitting the head to be adjustably rotated about the axis A. While the machine 24 may be powered in different ways, it is herein assumed that fluid pressure, preferably air, is employed. Accordingly, as will subsequently be explained a pneumatic means in the form of a double-acting piston-cylinder device (not shown) is operatively connected to linkage including ball-seated lever 51 and a driver 52 (FIGS. 1-3) for actuating operating instrumentalities of the head, and a separate piston-cylinder device 54 (FIGS. 3,9) is actuated in timed relation to operation of the head for controlling the indexing means 30. The head instrumentalities and their sequential relationship in response to the vertical motion of the driver 52 in the head in an operating cycle of the machine will be described first, and thereafter the indexing means 30 will be more fully disclosed. It may be noted that certain of the drawings show by heavier section lines that some of the parts include end or bumper portions, not separately designated, of nylon or the like for contacting other parts with quiet, durable operation.

DRIVER-PUSHER MECHANISM

Figure 15:
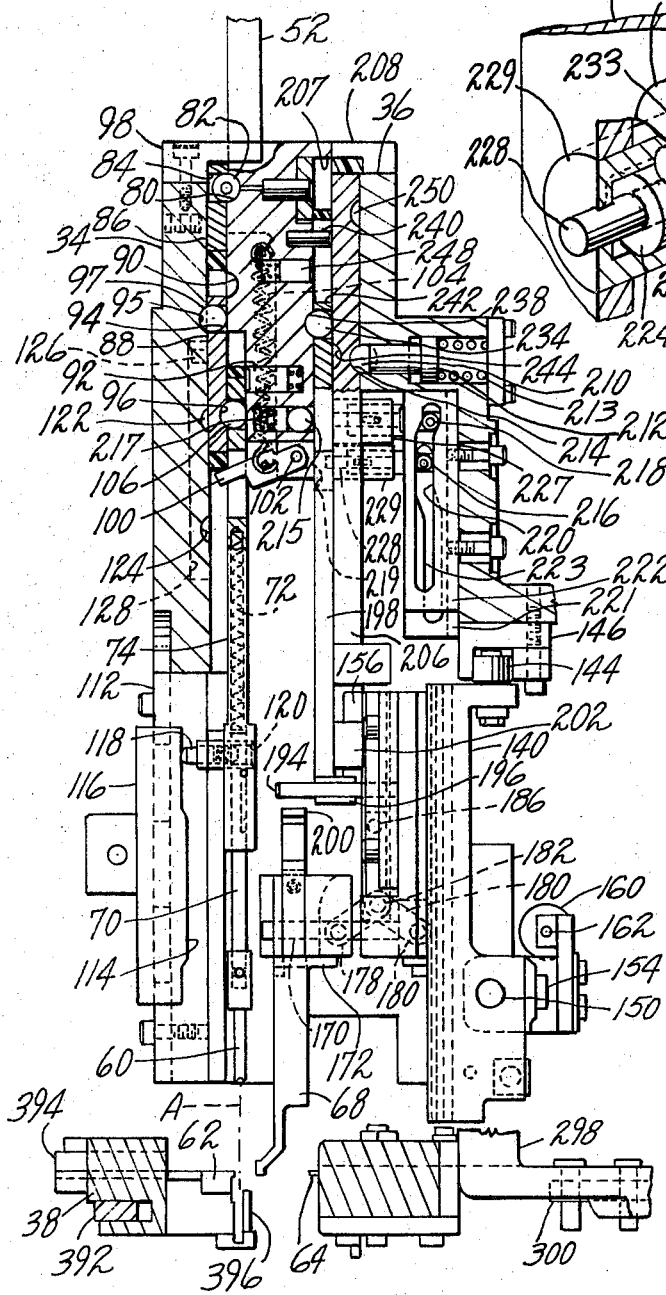
FIG. 15 is a view in right side elevation of the actuating means for the fingers and a component pusher, the parts being at the start or "up" position of a cycle.

Continuous movement of the driver 52 downwardly and, after a dwell for the cut-clinch operation, then reversing along the axis A in each cycle is effective to yieldingly insert each component by means of a pusher 60 (FIGS. 2,3,15,17,20), the leads L,L of the component being first shorn by front and rear knives 62,64 respectively, while held and guided by respective pairs of fingers, the inner ones of which are designated 66 and the outer ones 68. Actuting connections for these knives and fingers are later described, though their functions as shown in the timing chart of FIG. 20, are concurrent with and derived from the driver-pusher mechanism now to be further described. The pusher 60, in order to suitably accommodate different sizes and shapes of components C, is detachably and yieldably mounted, being screw-connected to the lower end of a vertical rod 70 which is spring-loaded downwardly by a spring 72 (FIG. 15) and slidable in an axial bore of a bar 74 (FIGS. 3,15-17) unless locked thereto by means soon to be described. The rod 70 is retained in the bar 74 by a pin 75 (FIGS. 17A,B) transversely fixed in the bar. The driver 52 slides in a vertical guidway 76 (FIG. 3) formed in the rear housing block 36 and has a laterally extending portion or connected extension 78 (FIG. 3) for purposes later mentioned. Vertical driving guidance is provided also by rolls 77,77 journalled on a depending arm 79 of the portion 78, the rolls 77 being guided in a vertical slot 81 (FIG. 3) in the front housing block 34. For operatively connecting up the bar 74 and the driver 52, the latter has a transverse groove 80 (FIGS. 3,15-17) receiving a roller 82 nestable in a slot 84 in a dwell block 86 arranged upon descent to abut, at times, the top of a drive block 88. The driver 52 is also formed with a countersink 90 (FIGS. 3,15-7), a spring-loaded ball seat 92, and a bumper surface 93 (FIG. 3) for purposes later mentioned. The block 88 is formed with a ball hole 94, which in the "up" position (FIGS. 15,17C), is disposed for receiving a ball 95 partly nested in countersink 97 of the block 34, and a countersink 96 for purposes to be indicated. For stabilizing the driving mechanism, a piece 98 secured on the front housing block 34 straddles the driver 52. For moving the blocks 86,88 upwardly at the beginning of each upward return stroke in an operating cycle, as subsequently explained, a return lever 100 extending forwardly beneath the block 88 is pivotally connected by a pin 102 in the driver and is yieldably urged upward about the pin 102 by a pair of springs 104,104 connected at their upper ends to the driver In the initial or "up" position at the start of a cycle of the head operating parts (FIGS. 15,17C), the block 86 is locked to the driver 52 by the roller 82 being in the groove 80 as shown in FIG. 15. A component C is in aligned position with the axis A for insertion, and the pusher 60 is extended relative to the rod 70. Also, the bar 74 is then locked to the block 88 by a ball 106 in the bar being partly received in the countersink 96.

Merely for simpler consideration of the structure and the inserting portion of the cycle, description will focus on several successive stages which follow the initial or driver "up" position. Thus, at an early point of the descent of the driver 52 with the block 86, for instance while they are moving down about 0.35" in the illustrative machine, the bar 74 and the block 88 remain stationary. This permits a sufficient dwell in the pusher's motion downward to enable the fingers 66,68 to grip the indexed leads L,L. Then the block 86 contacts the top of the block 88. Now the ball 95 is cammed out of the socket 97 and into the countersink 90 to allow the pusher 60 to start downward for finding and contacting the indexed component body C as shown in FIG. 7B. At pusher contact with the body, the pusher 60 stops descent while the driver continues down, the rod 70 compressing the spring 72. At a third stage shown in FIG 17A, assumed to be at about 3.0" down from the driver's starting position, for example, a bumper on the bottom of the block 88 engages stops 110,112 (FIGS. 2,3,15) which are secured, one on each side of a face cam 114 of a plat 116, both the stops and the plate being bolted on the front housing block 34 and extending through an opening therein. This of course also stops descent of the bar 74 and the block 86, but it should be noted that during the descent of the bar 74, the rod 70 and hence the pusher 60 had become frictionally locked thereto by reason of a spring-pressed cam follower 118 engaging and being displaced rearwardly by the rise in the surface of the cam 114. The following 118 consequently has forced a plug 120 rearwardly to effect the frictional coupling of the pusher 60 and the bar 74. At this stage three, then, the block 86 and the block 88 become locked to the housing since the roller 82 now is ready to shift partly out of the groove 80 and into a countersink 112 in the block 34, and the ball 95 is ready to partly out of the countersink 90 and into a countersink 124 formed in the housing 34. Downward movement of the rod 70 and the pusher 60 accordingly has been arrested as the driver 52 continues downward until its surface 93 contacts the bumper top of the bar 74 (FIG. 17B), this dwell of the pusher advantageously occurring as noted in FIG. 20 to give the fingers 66,68, then substantially at the level of the board B, a chance to retract rearwardly from the leads L,L about to be further inserted.

Next, there follows the final downward stage of the driver 52 (FIGS. 17B,E) wherein, the driver surface 93 having engaged the rod 74, and the component leads L not meeting resistance to descent, the pusher 60 proceeds down with the rod 74. The follower 118 now descending beneath the rise of the cam 114 as indicated in FIG. 17B, the energized pusher 60 is axially released from the rod 74 and moves the component body toward the board B, the inserting being limited to the extent imposed by the board B or preformed crimping K, if any, of the lead legs L. Such crimping is illustrated at K in FIG. 2 and determines stand-off of component bodies above the board B. As indicated in FIG. 20, at this point a signal is normally given to effect operation of the cut-clinch mechanism 32. In the course of this final descent stage the driver 52 engages the top of the rod 74 at which time the spring ball seat 92 is opposite the ball 106. So when the rod 74 moves, the ball 106 is shifted out of the countersink 96 and into the spring seat 92 as shown in FIGS. 17B,E thereby relatching the driver with the rod 74. Descent of the driver terminates when an adjustable stop screw (not shown) threaded into the frame 28 engages the lever 51 (FIG. 1). Total descent of the driver 52 may, for instance, be on the order of about 3.4" in the illustrative machine 24.

Upward movement of the driver 52,78 commences with reversal of the double-acting piston-cylinder (not shown) controlling it to return the parts to their starting positions and relationships. Accordingly the driver and the rod 74 start upwardly together until the ball 106 is opposite countersink 96 at which time the ball seat 92 pushes the ball 106 into the counter-sink 96. This locks the rod 74 to the block 88. The driver continues upward, and the lever 100 under influence of the springs 104 engages the underside of the block 88 driving it and the block 86 upward also. This occurs when the countersink 90 arrives opposite the ball 95. The upwardly moving block 88 causes the ball 95 to shift out of the countersink 124 and into the countersink 90. The block 88 engages and raises the dwell block 86 thus causing the roller 82 to shift out of the countersink 122 and into the groove 80. A stop pin 126 projecting forwardly from the block 88 into an elongated vertical slot 128 formed in the housing block 34 engages the upper end of the slot thereby stopping upward movement of both the block 88 and the rod 74. The ball 95 is restored to nesting in the countersink 97 from the countersink 90. In the last portion of the driver upstroke with the block 86, the lever 100 engaging the block 88 is urged counterclockwise (as seen in FIG. 15) about its pivot 102 to again place the springs 104 in tension. Ascent of the driver 52 terminates when an adjustable stop screw (not shown) threaded into the frame 28 engages the lever 51.

Lead Control Finger Mechanism

Each of the leads L to be inserted is to be guided into the board by one of the inner fingers 66 aforementioned and its cooperating outer finger 68. Before describing their actuating means it may be noted that, deriving their motion simultaneously from the cyclical driver 52, the fingers 66 and 68 in each cycle will be moved forward and backward relative to the axis A, and up and down, i.e. in the direction of that axis; the outer fingers 68 additionally are caused at one stage to move laterally to close on an indexed lead to seize it and determine its spacing from the axis A as will be described.

Means is provided for manually adjusting the widthwise spacing of the pairs of fingers 66,68 which are V-grooved at their lead-clamping ends. It will be understood that such lateral adjustment to accommodate variable center spacing of the leads may alternatively be effected automatically by known controls when so desired. As shown herein (FIGS. 3,4,15,19) a pair of housing guides 140,142 respectively support a cam follower 144 arranged to be received in a widthwise track provided by parts 146,148 which are secured to the underside of the rear housing block 36. The guides 140,142 are laterally movable together and apart on a rod 150 secured in the housing block 36 and housing corner 40. The guides 140,142 provide, respectively, a vertical track for heightwise sliding movement of a pair of finger supporting carriages 156,156, floating guide pins 158 facilitating such movement. The guides 140,142 are locked on the rod 150 at selected widthwise spacing by means of a center binder screw 154 (FIG. 15). For laterally adjusting the guides 140, 142 when that screw is loosened, a knob 160 on the end of a screw 162 formed with right and left-hand threads is rotated. The screw 162 is threaded into blocks 164 secured to the guides 140,142, respectively. A block 161 mounted to the housing block 36 and in which the screw rotates is provided for preventing endwise movement of the screw 162, a collar 163 being clamped to the screw 162 on opposite sides of the block 161. Means is preferably provided, such as a spring 166 (FIG. 4), for taking out backlash between the blocks 164 and the screw 162.

Figure 18:
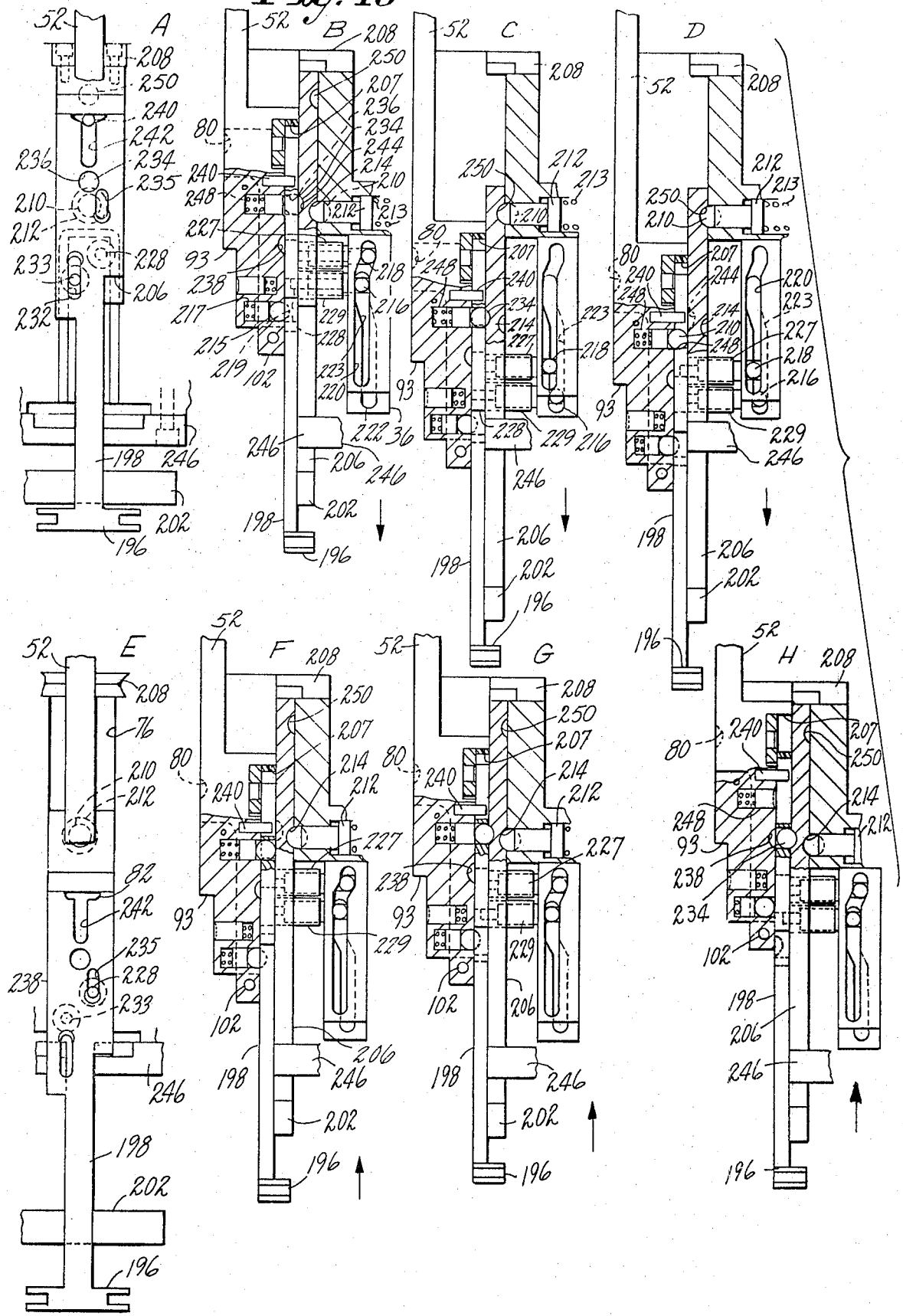
FIGS. 18A through 18H are front and side elevations showing relative heightwise positions within a cycle of finger drive mechanism in sequence except that FIGS. 18D and 18E illustrate parts in corresponding bottom positions.
Figure 19:
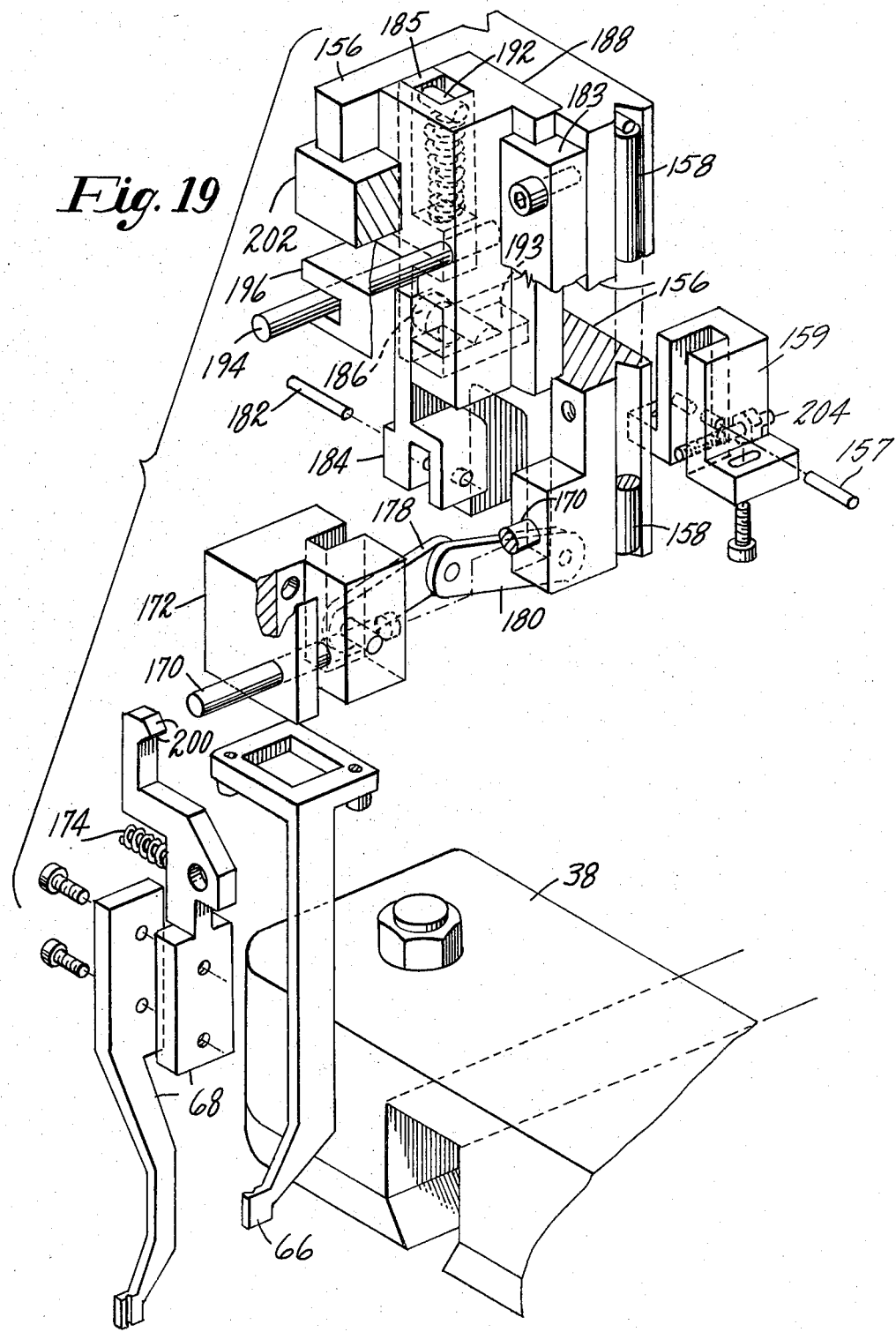
FIG. 19 is an exploded perspective view of mechanism for operating a pair of cooperative lead controlling fingers.

Respectively secured to front portions of the carriages 156, 156 are pins 170,170 slidably mounting finger-supporting blocks 172,172 respectively. As shown in FIG. 19, the upper end of each inside finger 66 is affixed to one of the blocks 172 to partake of its motion. The outside fingers 68, respectively, are pivotally mounted on the pins 170,170 and, if desired, may be composite as indicated. A spring 174 (FIG. 19) nested in the block 172 biases each outside finger to a normally open position adjustably determined by a stop screw (not shown) threaded in the blocks, respectively. The blocks 172, by reason of engagement of their flat sides with confronting flat walls of the carriages 156,156, prevent rotation of the fingers 66,68 about vertical axes. Rollers 176 (FIG. 3) journalled in both of the carriages 156 serve to guide the finger-supporting blocks 172 in their rearward and forward movements effected by pairs of toggle links 178,180, respectively. The front links 178 are pivotally connected at their front ends to the blocks 172, and the rear portions of the rear links 180 are respectively pivoted to a pin 157 (FIG. 19) in a block 159 having adjustable screw and slot connection to the carriage 156. As indicated in FIG. 19, a knee pin 182 of the toggle 178, 180 is carried by the lower forked end of a drive link 184 which is itself pivotally supported at its upper end on a pin 186. The latter is fixed transversely in a spring-loaded side block 185 which is yieldable heightwise. For this purpose a spring 190 confined by a pin 192 in a vertically slidable block 188 bears downwardly on a shoulder formed on the block 185. As shown in FIG. 19, an end portion of the pin 186 is flatted to abut a bumper 193 secured on the block 188. An actuator pin 194 projecting forwardly from each of the blocks 188 extends through opposite slots of a crosshead 196 of a vertically disposed bar 198 (FIGS. 3,15,18). Motion of the bar 198 effects forward and rearward finger movement and finger closure. The front ends of the pins 194 are arranged to engage cam shaped upper ends 200 of the outside fingers 68,68, respectively, to effect and maintain their lateral movement for closure on and release of the positioned leads L engaged by the inside fingers 66,66 at the appropriate time in a cycle. The blocks 188 are mounted to the carriages 156 by means of a gib 183 (FIG. 19) so that the blocks 188,188 can move heightwise relative to the carriages 156,156.

To trace actuation of an outside finger 68 and an inside finger 66 from the motion of the driver actuated bar 198, descent of the latter causes downward movement of the block 188 (FIG. 19). Hence the pin 192 acts through the spring 190 causing a flat portion of the pin 186 to bear against the bumper 193 in the block 188, the blocks 188 and 185 descending together. This yieldingly actuates the drive link 184 (FIGS. 3,19) downwardly, effecting straightening of the toggle 178,180 to shift the fingers forwardly, towards the axis A. The pin 194 now engages the cam surface 200 of the outside finger 68 to close it inwardly for lead clamping. Further downward motion of the pin 194, by reason of the shape of the cam 20, reverses the procedure, i.e. causes the fingers to open and rearwardly retract. The rearward position of the fingers 66,68 is adjustably limited (for instance to insure avoiding contact with any previously inserted component on the board B) by abutment of the link 180 with a stop screw 204 (FIG. 19) adjustable endwise in the block 159. Upon such abutting, the toggle links 178,180 and the blocks 172 and 185 stop, but the inside blocks 188 can continue their down-stroke simply compressing the spring 190.

Heightwise motion of the fingers is effected by the slide bar 202 and a bar 206 (FIGS. 3, 17, 18) integral therewith, which is disposed just in back of the bar 198 and is connected to the carriages 156,156 to which the fingers are operatively connected as above described. The bars 198 and 206 move the fingers, when closed, down to the board along with the indexed component C. The finger supporting blocks 172,172 move heightwise on the guide pins 158 retained by the housing guides 140,142. The driver 52 and the bars 198 and 206 are all in their "up" positions as shown in FIGS. 15 and 18A at the start of a cycle, the bar 206 then abutting bumper 208 (FIG. 3) secured to the block 36 and held in position by a ball 210 (FIG. 15) which is spring-loaded by a spring 213 pushing on a piston 212 and is nested in a countersink 214 in the bar 206. The piston 212 is reciprocable in a bore formed in the block 36.

A pair of release pin mechanisms (FIG. 15a) controls relationship heightwise of the bars 198,206 as will next be described. Lower rolls 216 (FIGS. 15, 18B,C,D,) and upper rolls 218 are respectively arranged to run in cam tracks 223,220 provided by U-shaped blocks 221,222, respectively, secured to the rear housing block 36. The rolls 216 are secured to a shaft 225 (FIG. 15B) in a lower housing 224 by snap rings. A pin 228 is held in the housing 224 and urged to the left as seen in FIG. 15 by a spring 226. The housing 224 and the pin 228 are yieldingly held together by a pin 230 transversely extending through axial slots formed in the housing 224. Within the bar 206 is a sleeve 229 having two coaxial bores of different diameter extending rearwardly for receiving the housing 224 and the pin 228. The smaller end of the pin 228 extends forwardly into a vertical stop slot 232

(FIGS. 3,18) in the bar 198. Upper return pin 233, associated in like manner with the upper roll 218 and an upper housing 237 and sleeve 227 (FIG. 15a), is then rearwardly retracted from its slot 235 in the bar 198 as indicated in FIG. 15. The bar 198 is held in its upper position by a ball 234 seated in a through-hole 236 in the bar 198 and in a countersink 238 in the driver 52. For return stroke purposes a pin 240 projects rearwardly from the driver 52 and, at the cycle start, engages the upper end of a vertical slot 242 in the bar 198.

Other portions of the ball transfer mechanism operable to enable the driver 52,78 to control heightwise positioning of the fingers 66,68 will next be described with regard to the successive positions of the driver in its cycle and having reference to FIGS. 15,16,18 and 20 mainly. FIGS. 18A to 18D depict the upper and successive down positions respectively; FIG. 18E corresponds to 18D; and FIGS. 18F-H show successive return or upward positions, respectively. At the moment (previously mentioned in connection with the pusher 60) when the driver 52 has descended about 0.35", for instance, carrying the bar 198 downward also, the wall of the upper end of the slot 232 is engaged by the extended pin 228 and the bar 198 stops. The ball 234 now shifts from the countersink 238 in the driver and into a countersink 244 formed in the front of the bar 206 locking the bars 198 and 206 together. Both of the bars 198 and 206 are stopped and held in place by the balls 210 and 234 as the driver 52 continues descent.

When the driver has descended, for instance, an additional approximately 0.70"(FIG. 18B) in the illustrative machine, a surface 207 (FIG. 15) of the driver contacts a bumper on top of the bar 198 so further driver descent causes the ball 210 to release the bar 206. The bar 198, by means of the pin 228 and the ball 234, drives the bar 206. Downward motion of the bars 198, 206 relative to the driver 52 is prevented by a spring 217 (FIG. 18B) in the driver acting on a ball 215 partly in the driver, the ball 215 now shifting into a countersink 219 in the bar 198.

After a further driver descent of about 2.0", the bar 206 stops upon engagement with a bumper 246 (FIGS. 3,18C) secured to the housing block 36. The ball 210 moves into a countersink 250 to lock the bar 206 in its down position. During this portion of the driver movement, the pin 233 and housing 237 are urged forwardly by the cam track 220, the spring 231 being compressed as slot 235 is not yet opposite the pin 233. The stop pin 228 and the housing 224 are pulled back by the track 223 so the pin 228 is no longer in the slot 232 in the bar 198.

In the interval wherein the bar 198 is descending about 0.35" further (FIG. 18D), the fingers 66,68 are opened and moved rearwardly from the leads L to clear the component about to be inserted. The upper slot 235 comes opposite to the pin 233 which moves into the slot 235 via the spring 231. When the bar 198 started this portion of its movement, the ball 234, which is now opposite to spring-loaded plunger 248 in the driver 52 moves out of the countersink 244 in the bar 206 and into the spring-loaded plunger hole 248 in the driver. This locks the driver and the bar 198 together. Downward movement of the parts ceases.

As the driver 52 retracts upwardly (FIGS. 18F–H), it carries both the bar 198 by means of the balls 234 and 215, and the bar 206 by means of the upper extended pin 233. As the driver starts up, the ball 210 is forced rearward to allow the bar 206 to rise. The ball 234 cannot disengage from the bar 198 because of the upward movement of the driver. During this movement, the lower pin 228 is forced forwardly against the bar 198 effecting compression of spring 226 as slot 232 is not opposite the pin 228. As the first 2.0" of upward movement of the driver 52 is completed, the upper pin 233 is pulled back out of the bar 198 by the track 220, and the inertia of parts helps bring the bar 206 into stopping position against the bumper 208 and allows the ball 210 to reseat in the countersink 214.

Further upward movement of the bar 198 (about 0.35") by driving connection of the balls 234 and 215 proceeds until the ball 234 comes opposite the countersink 244 whereupon the plunger 248 pushes the ball 234 into the countersink 244. This locks the bars 198 and 206 together and permits the lower pin 228 to shift into the bar 198 as the top of the slot 232 is then opposite the pin 228. The bar 198 then remains stationary awhile, while the driver continues its upward movement (about 0.70"). As the driver continues upward, the ball 215 moves back against its spring 217 and into counterbore in the driver thus allowing the latter to continue while the bar 198 remains stationary. At the end of this portion of the driver travel, the bars 198,206 do not move until the return pin 240 bottoms out in the slot 242 at which time the counter sink 238 is opposite the countersink 244. The upward driver movement then shifts the ball 234 out of the countersink 244 into the countersink 238 whereupon the ball 198 and the driver 52 complete their upstroke.

Knife Operating Mechanism

Mechanism for operating the rear knife 64 will now be described having reference mainly to FIGS. 3–8, 10 and 12. By means of a ball 262 (FIGS. 10,11) the driver portion 78 drives a plate 264 in a guideway 260 of the block 36, the ball being seated in a throughhole 266 in the plate 264 and a countersink 268 in the driver portion 78. When the plate 264 has descended as indicated by dash lines in FIG. 10, to strike a bumper 270 on the frame portion 40, a countersink 272 in the housing block 36 and the ball 262 are aligned and the ball transfers partly into the countersink 272 thus locking the plate 264 heightwise and enabling the portion 78 to further descend for front knife lead cutting as later described. While the plate 264 is descending, a pair of rolls 274 (one only shown in FIGS. 3,10) which run in parallel slots 276 formed in the forked bottom of the plate 264 serve as a sliding pivot for a toggle link 278. The rolls 274 are coaxially retained on a pin as by snap rings. The link 278 is connected at one end by a knee pin 280 to an end of a toggle link 282, the other end of which is pivoted to the front block 34 by a pin 284 (FIGS. 5,10) and has clearance for vertical movement as afforded by a slot 286 therein. The other end of the link 278 is forked and connected by a pin 288 (FIG. 3) received in a bearing block 290 mounted in a trunnion block 292. The latter is mounted in a rotary collar 294 (FIGS. 3–6, 8B and 12) clamped onto the tubular upper end of a sleeve 296 rotatably mounted in a vertical bore in the frame portion 40. The lower end of the sleeve 296 is formed as a crank arm 298 which is connected pivotally by a link 300 to the rear end of the knife 64. It will be understood from the foregoing that the descent of the plate 264 effects forward movement of the rear knife 64 to shear the leads L,L of a component C in cooperation with the front knife 62 and, upon subsequent ascent of the plate 264 in the cycle, the rear knife 64 is retracted out of the way of the fingers 66,68 so they can approach the board B. Forward motion of the knife 64 occurs as links 278,282 move down to a horizontal position. As these links continue down, the knife 64 retracts. In the return upstroke of the driver portion 78, a return pin 302 (FIG. 10) in the plate 264 engages the lower wall of a slot 304 in the portion 78. This causes the ball 262 to transfer out of the housing countersink 272 and into the countersink 268 whereby the plate 264 is restored to its "up" position for recycling.

The rear knife 64 (FIGS. 7A,B,C) slides horizontally in the housing 38 and is retained therein by plates 306. A lead locater 308 preferably is slidably mounted in the knife 64 and detachably retained by a ball plunger 310 extending into a slot 312 in the locater. The locater 308 is yieldingly urged forwardly by a spring 314 so that a pair of V-notches 316,316 of the locater spaced to correspond with the proper lead spacing of the components C to be inserted can engage and at least tend to center the lead legs L just before they are shorn. In the event adjustability for lead spacing is provided for by automatic mechanism in lieu of the knob 160, it is expected the leading edge of the locater will be linear and not formed with the grooves 316.

For actuating the front knife 62 in response to heightwise motion of the driver 52-78, the following means is provided, having particular reference to FIGS. 3, 5-8, and 10-12.

Figure 11:
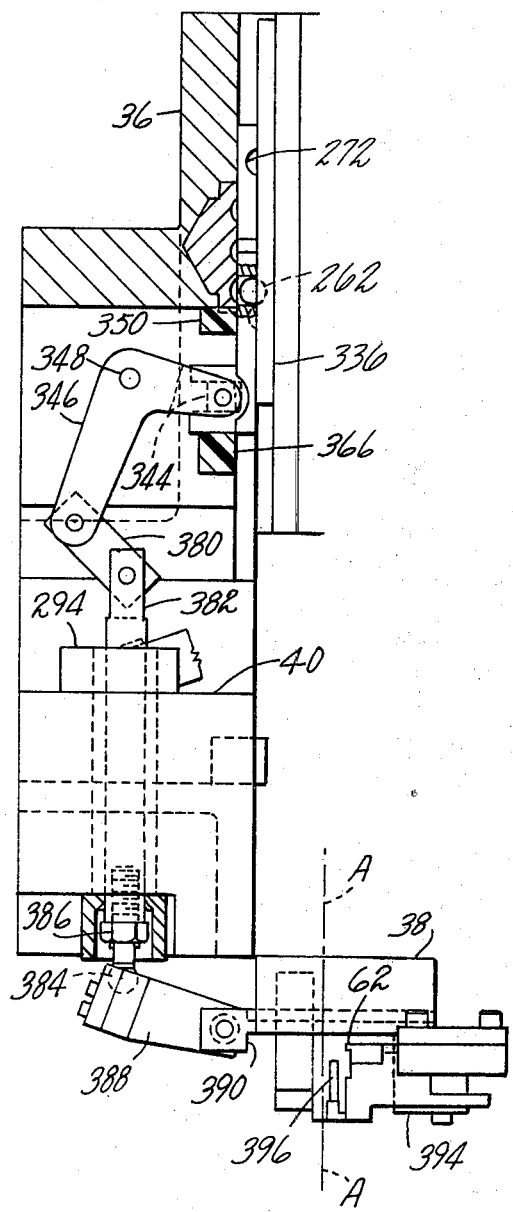
FIG. 11 is a view similar to FIG. 10, but with rear knife linkage removed, the parts being shown at a different stage for driving the front knife in a cycle.
Figure 12:
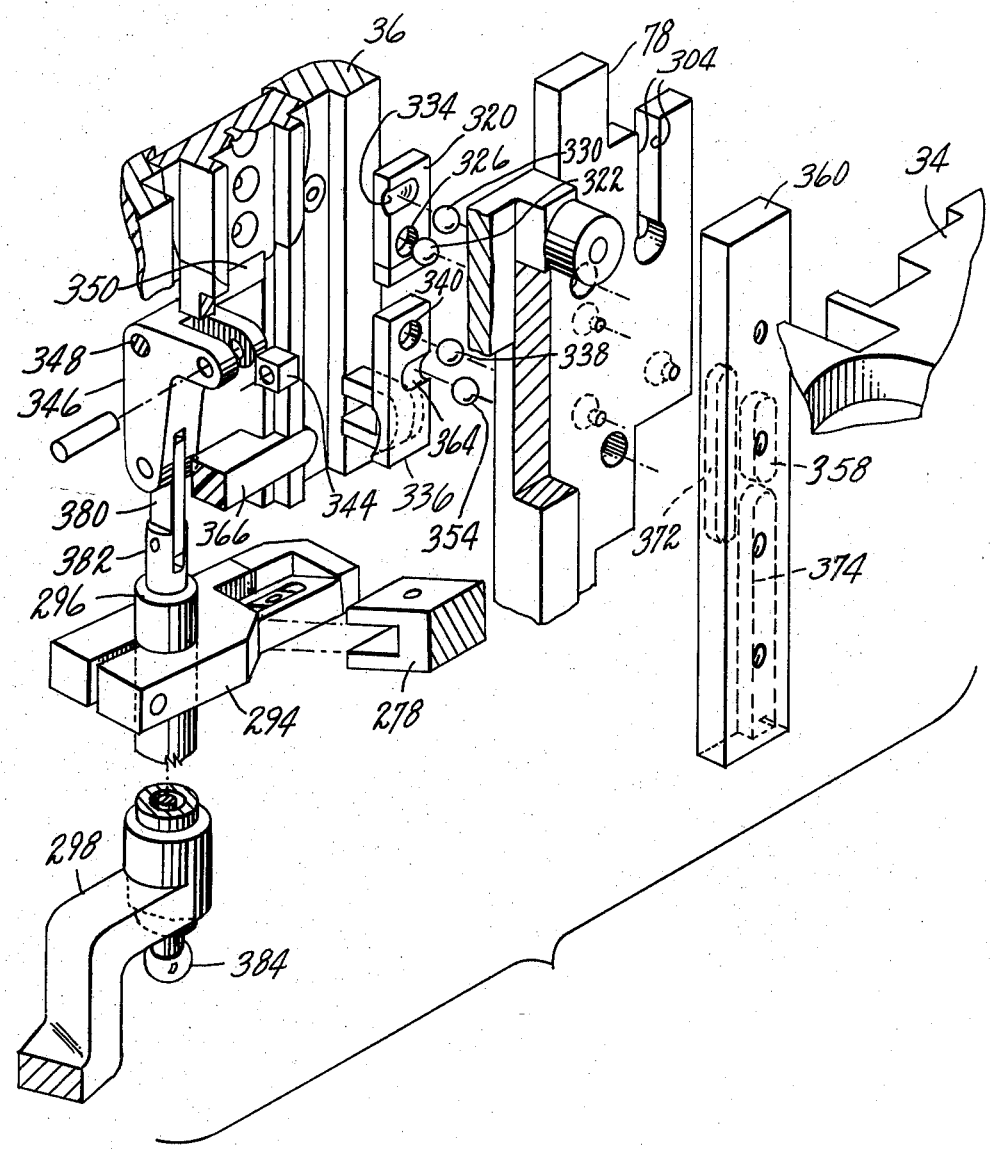
FIG. 12 is a detail in perspective, with a portion broken away, showing a portion of the actuating mechanism for the front knife.
Figure 13:
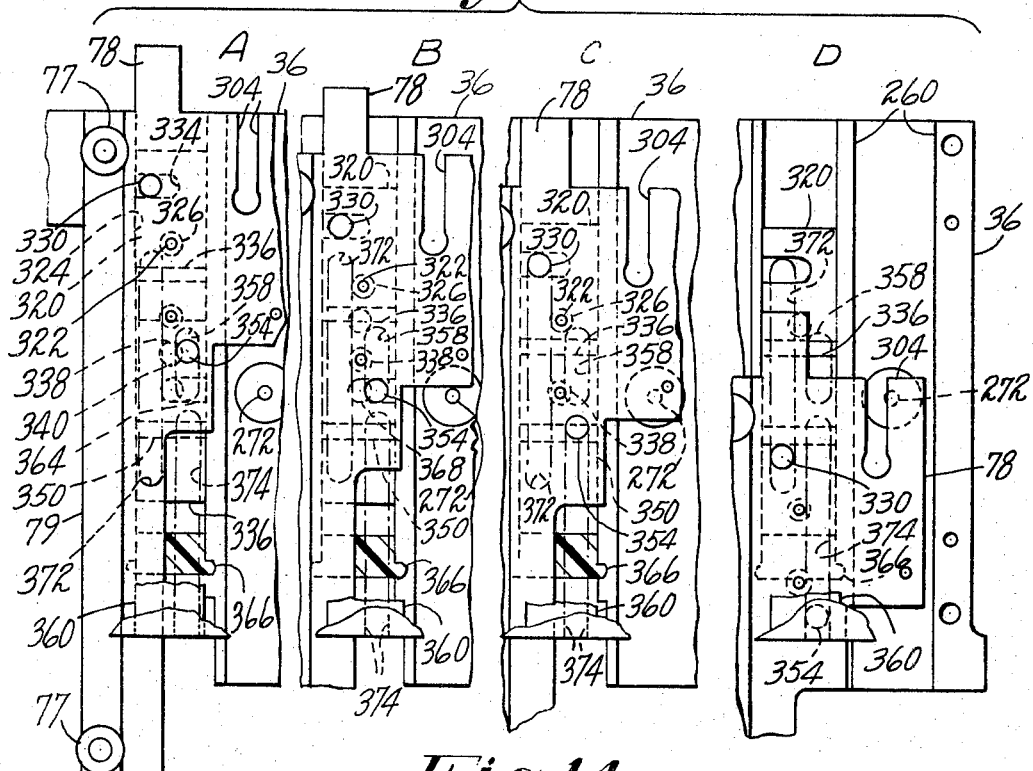
FIGS. 13A,B,C, and D, and 14A,B,C and D are corresponding sets of somewhat schematic front and side, respectively, sequential views of the front knife ball transfer mechanism.
Figure 14:
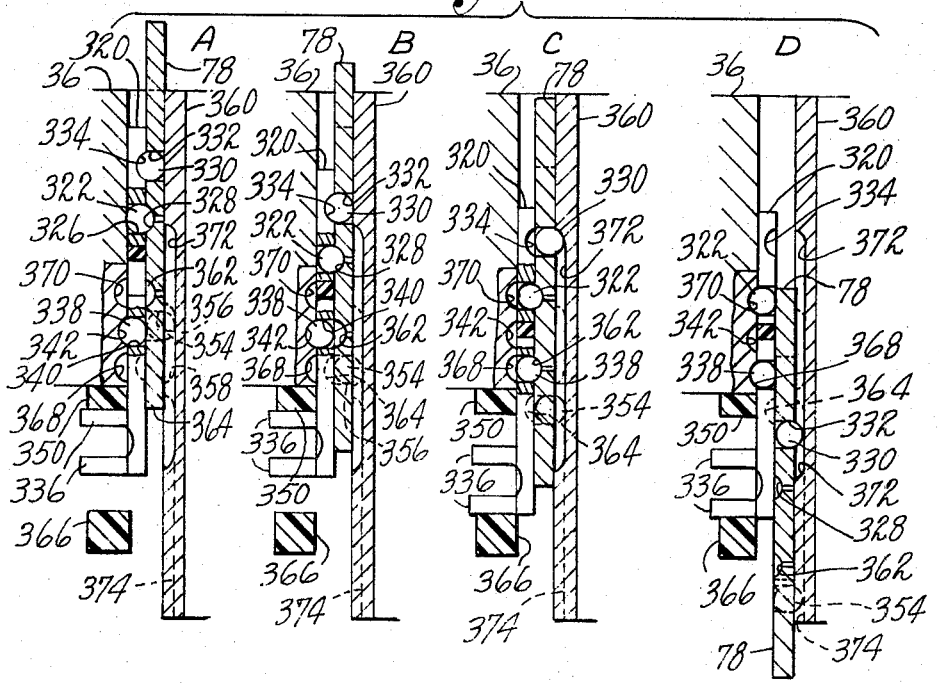

In the "up" position of the portion 78, a block 320 (FIGS. 3, 12-14) slidable vertically in a guideway 324 of the housing block 36 is held by a ball 322 seated in a through-hole 326 of the block and in a countersink 328 in the portion 78 as shown in FIG. 14A. Also at this time a ball 330 in a hole 332 in the portion 78 is seated in a countersink 334 of the block 320. It may be noted, too, that the block 320 is then just above the top of a slide block 336 also in the guideway 324. The block 336, motion of which controls the front knife 62, is releasably held in its "up" position by a ball 338 then in a through hole 340 of the block 336 and in a countersink 342 in the housing block 36. A clevis formed on the back of the block 336 engages opposite sides of a block 344 (FIGS. 3,10,11) pivotally supported by a pin in an upper end of a lever 346. This lever (FIGS. 3, 10-12) is pivotally mounted on a pin 348 fixed in the housing block 36. As shown in FIGS. 12 and 14A, the block 336 in its uppermost position is against a bumper 350 fixed in the housing 36, and for a reason later noted, a ball 354 is then nested in a through-hole 356 in the driver portion 78 and in a vertical groove or slot 358 (FIGS. 3,13) formed in the back side of a vertical bar 360 (FIGS. 3,12,14) secured to the front housing block 34.

The driver portion 78 and the block 320 move down (about a half inch, as shown), comparing FIGS. 14A and B, whereupon the block 320 engages the top of the block 336. At this point a countersink 362 is opposite the ball 338 so that, when the block 336 starts downward, the ball 338 is transferred out of the countersink 342 and into the countersink 362 thus freeing the block 336 for descent. Also in this interval, the ball 354 shifts out of the slot 358 on contacting its curved bottom and, being opposite to a countersink 364 in the block 336, is transferred thereto.

In FIGS. 13C and 14C the driver 52,78 has descended nearly an inch. The block 336 is now stopped by engagement with a bumper 366 secured to the housing. The block 320 also stops descent while the driver 78 continues downward. The ball 338 is now opposite a countersink 368 in the housing block 36 and transfers thereto from the countersink 362. The ball 322 is opposite a countersink 370 in the block 36 and accordingly is transferred from the countersink 328 into the countersink 370. This allows the balls 338 and 322 to be released from the driver 78. The ball 330 now coming opposite to a groove 372 in the bar 360, the ball 330 transfers from the countersink 334 in the block 320 and into the vertical groove 372. The ball 354 is opposite a vertical groove 374 in the bar 360 and shifts thereto from the countersink 364. Thus all four balls are released from the blocks 320 and 336 so that the driver portion 78 may itself continue to go down.

In the next position (FIGS. 13D and 14D), the driver downstroke is completed, having descended, for instance, a total of less than about 3-½ inches. The ball 338 is in the countersink 368. The ball 322 is in the countersink 370. The ball 330 is in the groove 372 formed in the bar 360, and the ball 354 is in the groove 374 so the blocks 320 and 336 are locked in position to commence their upstroke. The parts will successively reassume the relationships described with respect to FIGS. 13C and 14C, and then as shown in FIGS. 13B and 14B, balls 354 and 330 causing upward movement of the blocks 336 and 320. Accordingly the block 336 re-engages the bumper 350 and becomes locked. The driver portion 78 continues upward with the block 320 to their starting "up" positions determined by an adjustable stop screw (not shown) threaded in the driving linkage connected to the driver 52.

The lower end of the front knife operating lever 346 is pivotally connected to a link 380 having pivotal connection to the upper end of a stub shaft 382 (FIGS. 3,7,8 and 12). This shaft 382 is axially movable in an axial bore formed in the clamped sleeve 296. The lower end of the stub shaft is fitted with a ball end 384 by means of a checknut 386. The ball end 384 is clamped to one end of a link 388 the other end of which has pivotal connection to a link 390. The latter is slidable in a T-guideway in the block 38 for actuating a lever 392 pivoted to the housing. This lever by pin and slot connection operates a slide 394 in a guide block 396 secured to the housing block 38. The front knife 62 is connected to an end of the slide 394.

Figure 10:
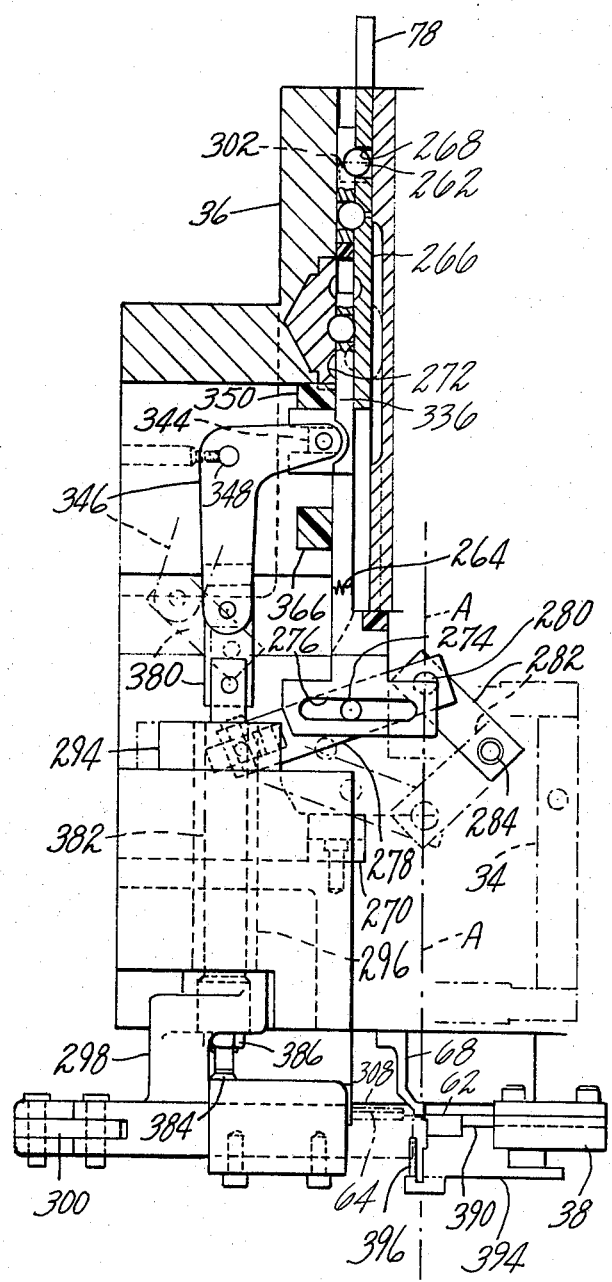
FIG. 10 is a somewhat schematic view in side elevation, with parts broken away, of mechanism for actuating the lead cutting knives.

From the foregoing it will be understood that, as shown in FIG. 20, at the beginning of the cycle, the front knife 62 is rearward for lead cutting. Early in the cycle, the front knife is moved forward as a consequence of the block 336 moving down to engage the bumper 350. This motion of the block 336 forces the lever 346 clockwise (as seen in FIGS. 10,11) causing the shaft 382 to move up. This moves the link 390 rearwardly and hence pivots the lever 392 counterclockwise as seen in FIG. 7 to provide the retraction of the knife 62 after its shearing cooperation with rear knife 64. It is at this time that a pair of spaced vertical tape-displacing pins 396,396 (FIGS. 3,5,8) secured to the knife-carrying slide 394 is moved forwardly. The pins 396 are disposed to engage and deflect the tape T transversely, preferably at points just upstream and downstream from the leads L respectively of the component to be inserted. This separates the tape T, moving a portion of it forwardly to strip the leads therefrom while they are held in alignment with their board inserting holes by the fingers 66,68. The pins 396 keep the displaced tape portion from interfering with the downward movement of the fingers and insertion of the cut leads thereafter by the pusher 60.

Component Feeding

The components C preferably have their leads L interconnected as by tape T for intermittent feeding during operation of the machine, the pair of leads being thus held at their lower portions in substantially equal spacing and vertically disposed. Reels of such components, with the tape pre-punched with sprocket holes H uniformly spaced, are available commercially. As indicated in FIG. 2, a leading end of the taped series of components advances from the left into the indexing means 30 and passes about 90° counterclockwise (as seen in FIGS. 3-7) around an indexing wheel 400 formed with radial sprocket pins 402. These pins 402 are spaced to be received by the respective tape holes H. Accordingly, indexing of the wheel, preferably by pneumatic mechanism next to be described, and with the aid of front and rear tape confining guides 404,406, advances each successive component so that the one next to be inserted by the pusher 60 has a midpoint between its leads L,L come into alignment with the inserting axis A which likewise is the center point between the fingers 66.

Figure 4:
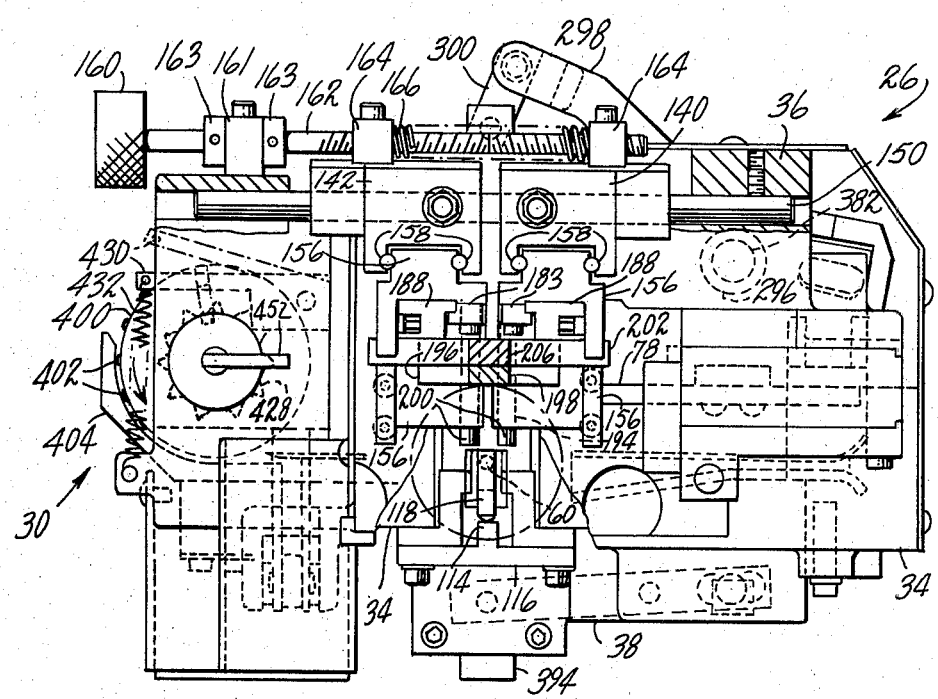
FIG. 4 is a plan view, partly in section, of the head shown in FIGS. 1-3.
Figure 5:
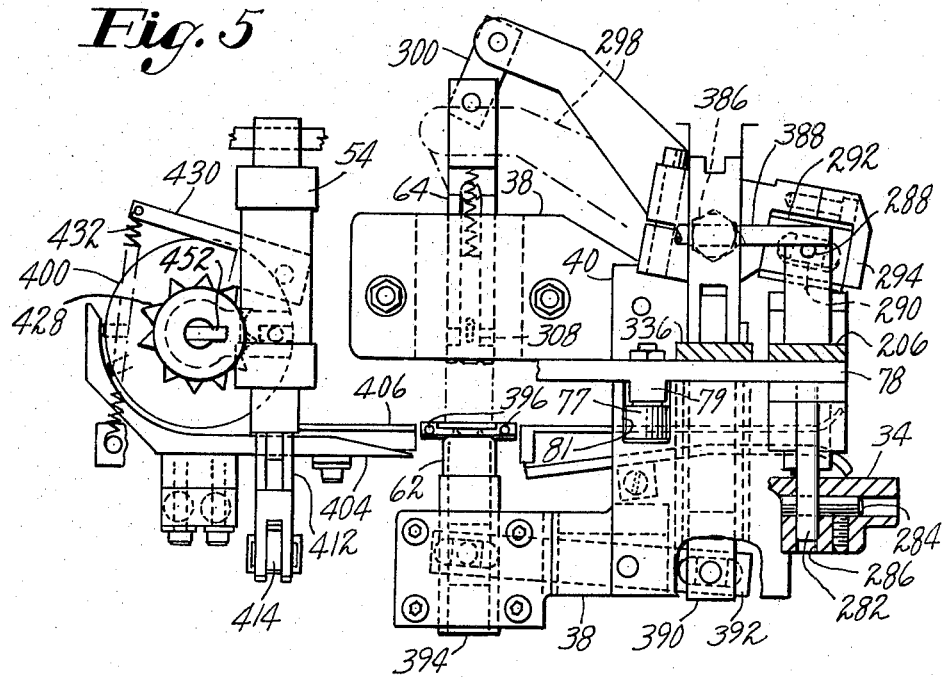
FIG. 5 is a view similar to FIG. 4 showing front and rear lead cutting knives at the start of a cycle.

The tape guides 404,406 are secured to the housing block 34 which also supports a cover 408 (FIGS. 1,2) for the feeding mechanism 30. The air cylinder 54 (FIGS. 2,3 and 9), actuated substantially simultaneously with the one mentioned above for moving the driver 52 down, is effective to retract its piston rod 412 rearwardly thereby rotating a lever 414 (counterclockwise as seen in FIG. 9) about its pivot 416 journalled in the housing block 34. Hence the lever 414, to which a push rod 418 is connected by a pin 420 received in a slot in the lever, shifts the rod to the right as viewed in FIG. 9. Yoke arm 422 (FIGS. 3 and 9) is connected to the rod 418 and has in it a one-way conventional clutch connection (not shown) to a vertical, rotatable shaft 426 on the lower end of which the feed wheel 400 is secured as will be explained. The arrangement is such that when the yoke arm 422 is moved clockwise, as viewed in FIGS. 3-6 and 9A, the shaft 426 is not rotated by the clutch and cannot then rotate a gear 428 secured on the shaft 426. The clutch does at this time rotate ineffectively and allows a pivotal locking lever 430 shaped for meshing with the gear 428 to rotate the gear counterclockwise for final positioning of the indexed component C. The lever 430 is pivoted on the block 34 and is yieldably urged toward meshing relation by a spring 432 (FIGS. 3,4).

As indicated in FIG. 20, at the end of a return stroke of the driver or insertion cycle the piston rod 412 reverses to move forwardly. The lever 414 is accordingly shifting the push rod 418 to the left as seen in FIG. 9 causing the yoke arm 422 to rotate and now drives the locking lever 430 through the clutch and hence rotates the gear 428. Consequent stepping of the wheel 400 advances the tape T with the components the appropriate feeding increments.

A knob 434 on the shaft 426 affords manual means for indexing a component. Additionally, a release mechanism next to be described is manually operable to permit the taped components to be removed from the machine as when, for instance, other types of components are to be inserted. For this purpose the shaft 426 is axially bored to slidably receive a rod 436. A piece 438 (FIGS. 9,9A) is pressed onto the lower end of the shaft 426 and has a tooth 440 on its lower surface. This tooth may be received in an axial mating slot 442 (FIG. 9A) formed in the upper surface of a member 444 to rotate the latter with the piece 438. The lower surface of the member 444 is provided with a cross key 446 receivable in diametric slot in a sleeve 448 so that it will rotate with the wheel 400 carried thereby. The sleeve 448 is secured on the shaft 426 by means of a retained ring 450. It will be understood that a lever 452 rotatable on a pin in the upper end of the shaft 426 has an eccentric bearing surface for engaging the upper end of the rod 436 and thus causing it to descend and depress a pin 454 secured to the member 444. When the pin 454 is thus depressed against resistance of a return spring 456 normally maintaining the member 444 and the piece 438 interlocked, they are disengaged thereby permitting the wheel 400 to be rotated in either direction.

For adjusting the extent of indexing steps the lever 414 threadedly carries a stop screw 460 (FIG. 9) engageable endwise with the housing block 34. In order to detect if a gap occurs in the tape T where no component C has been provided, a pivotal finger 462 (FIGS. 3,7,8A) is arranged to have one end engageable with the successive components. The sensing finger 462 is carried by a plate 464 adjustably secured to the block 38 and is biased toward component engagement. In the absence of a component, a tension spring 466 causes the finger 462 to contact a switch 468 which energizes a circuit to cause the cylinder 54 to reindex. This presents a component in alignment with the inserting axis A without requiring ineffectual cycling of the head 26.

OPERATION

A cycle of the machine 24 will now be briefly reviewed, assuming the indexing means 30 has indexed a next-to-be-inserted tape-carried component C into register with the inserting axis A of the head 26 as shown in FIGS. 2, 7A,B. From FIG. 20 it will be understood a succeeding component C will begin its indexing a little before the cycle to be described has been completed. The driver 52 with its extension portion 78 makes a continuous descent from its "up" position to the interval allotted for operation of the cut-clinch mechanism 32 on the trimmed and fully inserted leads L,L projecting beneath the board B. After the cut-clinch operation, the driver 52,78 ascends continuously to its starting position, the heightwise movement preferably being fluid pressure actuated. Prior to cycling, of course, the guides 140,142 for the finger supporting carriages 156,156 will have been appropriately adjusted widthwise relative to each other as by turning the knob 160.

A number of functions occur substantially simultaneously or in rapid sequence during the driver downstroke and as a consequence thereof. Thus, after a brief dwell at its "up" position, the pusher 60 is urged downwardly to engage the top of the component body. The lead locater 308 comes forwardly substantially to engage the front knife 62 yieldingly and thereby capture and correctly align the leads L,L of the indexed component in the V-notches 316,316 with the performed lead-receiving holes of the board B. (The front knife at this time is in its rearward position in the machine.) For this purpose the rear knife 64 is moved forwardly toward the leads adhead of forward movement of the front knife 62. The lead-control fingers 66,68 while still in their open and "up" positions are moved forwardly and then close to grip the located leads L,L just above the tape T and hold them in their aligned positions just prior to and while being shorn during further forward movement of the rear knife. Lead shearing occurs between the tape and the closed fingers 66,68.

Figure 16:
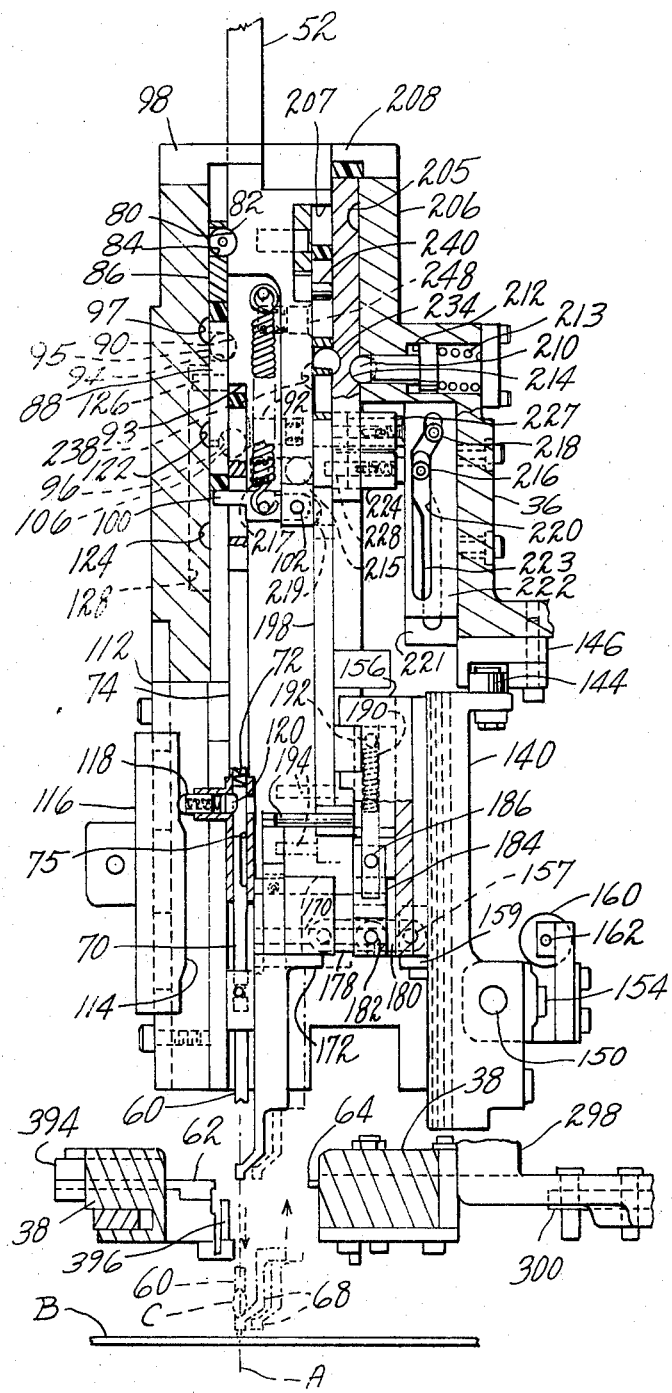
FIG. 16 is a view similar to FIG. 15, the parts being at a later stage wherein the fingers have been shifted forwardly, their path being indicated.
Figure 17:
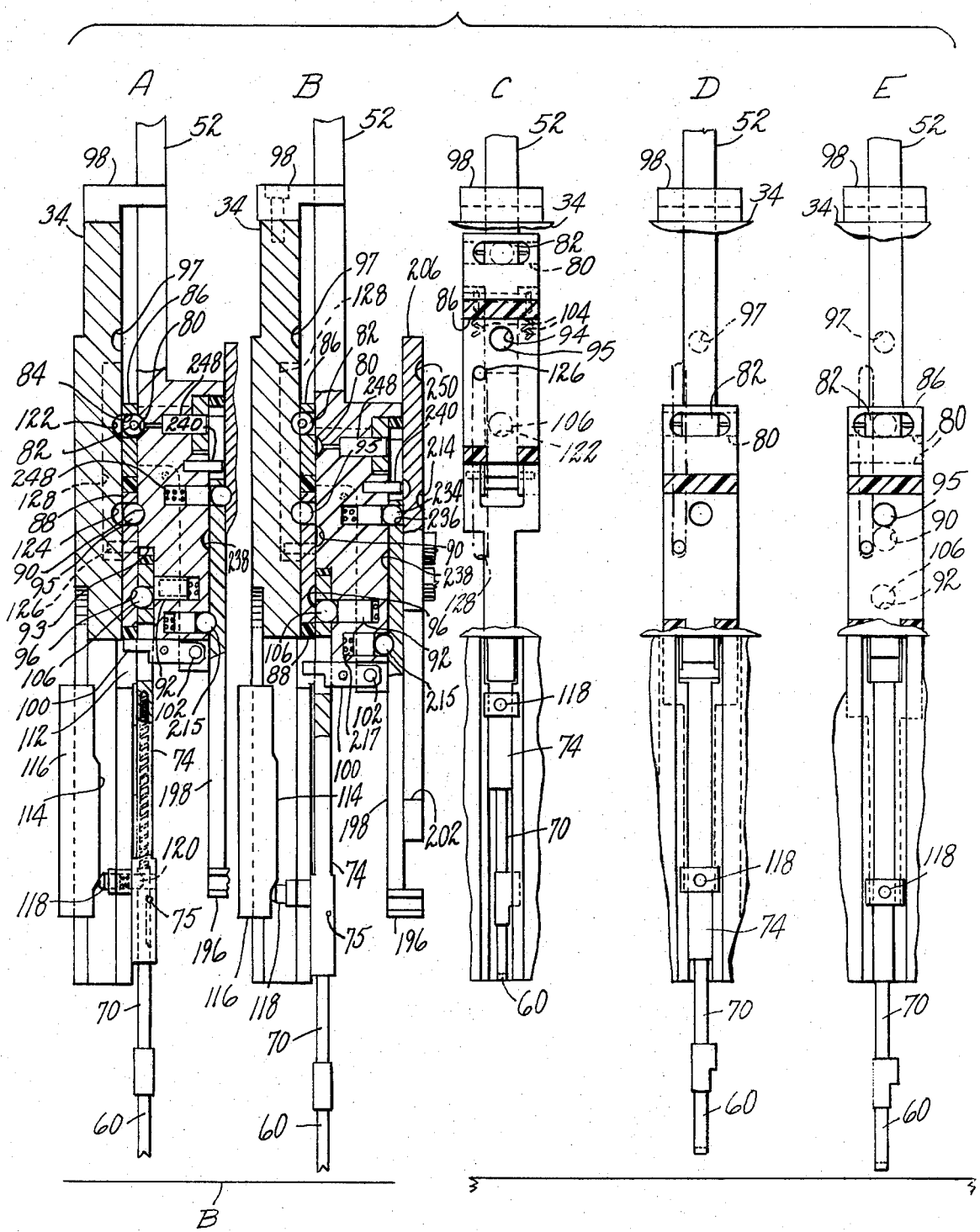
FIGS. 17A and 17B are side views, partly in section, of the pusher mechanism, and FIGS. 17C, D and E are front views of the same, FIG. 71C corresponding to FIG. 15, FIG. 17D corresponding to FIG. 17A, and FIG. 17E corresponding to FIG. 17B.

When the finger pairs 66,68 are caused by their respective toggles 178,180 to move forwardly by reason of corresponding movement of the blocks 172 slidable on their pins 170, respectively, the fingers are open due to the springs 174. Since the rear pivot of the toggle link 180 cannot move frontward or rearward, it is the pins 170 and their blocks 172 which move the fingers 66,68 forwardly until the knees of the toggles reach their straightened condition. This forward motion is attained, as above explained, from descent of the bar 198 and the drive link 184 caused by the driver descent. During this action the pins 194 are caused by the bar 198 to descend so that, when the fingers are forward as shown in FIG. 16, the pins 194 engage upper portions of the cams 200 to effect lead-clamping closure of the outer fingers 68 on their inner fingers 66. Further downward motion of the pins 194 reverses this procedure, i.e., reopens the fingers, and thereafter retracts them, as indicated in FIG. 20, by moving the knee of the toggle 178,180 below its straightened condition.

As FIG. 20 makes clear the fingers 66,68 do not open and retract until they have gripped the now trimmed leads L,L and descended with them substantially to the board B. This finger retraction is of course for clearing the way for further insertion of the leads by the pusher 60 acted on by the potential energy of its now-compressed spring 72 and further downward movement of the bar 74. This is to say that, as shown in FIG. 20, the fingers 66,68 open and start moving back on reaching the board B prior to which the pusher 60 will not be descending for an interval due to a dwell of the bar 74 relative to the driver descent. The continued descent of the driver 52 effects its engagement with the top of the bar 74 causing further descent of the pusher 60. The follower 118 (FIG. 17B) moves off the cam rise 114 whereby, the retracted fingers having guided the cut lead ends into the board B, the pusher 60 is released and enabled to thrust the leads downwardly to complete the insertion. The cut-clinch mechanism 32 is then actuated while the pusher is held down by the springs 72. Any upward thrust of the mechanism 32 on the component C is resisted by the closed fingers 66,68. The component body is held stationary by the pusher 60.

Figure 6:
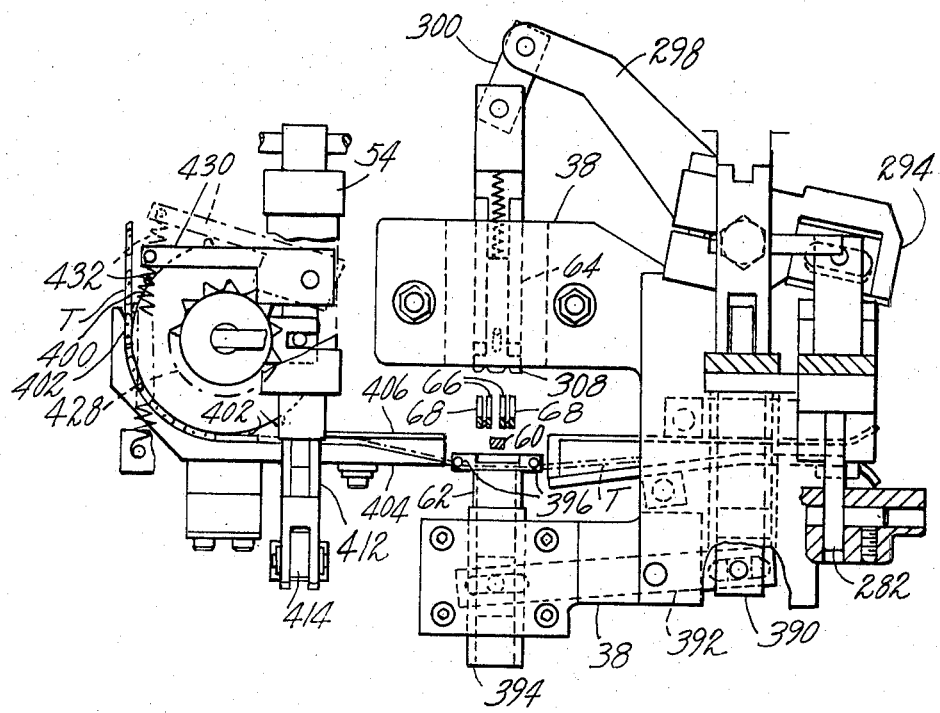
FIG. 6 is a view similar to FIGS. 4 and 5 and showing tape deflecting means and actuating means for the knives at a subsequent stage.

Particular note should be made that the leads which were positioned one on each side of the axis A are trimmed by the knives 62,64 above the tape portion holding the excess or expandable lower lead portions and beneath the upper insertable lead portions being exposed to and gripped by the fingers. When the rear knife 64 retracts rearwardly after lead shearing by the means previously described, the front knife 62 moves forwardly in the machine carrying with it the spaced pins 396. These are effective to remove from the immediate vicinity of the inserting axis A that portion of the tape T carrying the excess cut lead portions of the component about to be inserted. The tape guide 404, as shown in FIG. 6, tapers to allow this forward displacement of the mentioned portion of the tape T without any adverse affect on the indexing means 30. The sensor arm 462 is able to detect a component C missing from its position on the tape and effective to recycle the indexer 30, should a component not be in its place along the tape T, without recycling the head 26.

As above explained the upward stroke of the driver 52,78 is effective after that the cut-clinch operation to restore the head parts to their initial or "up" positions for recycling. The ball-transfer mechanism enables the driver 52,78 sequentially to actuate the pusher 60, the knives 62,64, and the sets of fingers 66,68 with speed and precision, yet avoids incurring the use of greater mass and size of parts, for instance rotary cams, which might alternatively be employed in a slower machine.

What is claimed is:

1. In a machine for inserting the leads of radial-lead type components into a circuit board, a driver cyclically reciprocable toward and from the board, means for feeding successive tape-mounted components into registration with the path of the driver, a pusher operable by the driver yieldingly to accommodate different body shapes and sizes of the components and to urge the leads of each component endwise into the board, cooperative fingers movable to grip and guide the leads of each component while it is acted on by the pusher, and cooperative knives for separating each component from the tape and shearing the leads to be inserted by the pusher while they are under the control of the fingers, means for shifting that portion of the tape holding the excess lead portions out of the path of the component to be inserted and the closed fingers guiding its leads; and means to actuate the fingers and knives in sequence in response to movement of the driver.

2. A machine as in claim 1 wherein the driver is operatively connected to said pusher, fingers, and knives by ball transfer mechanism to control their sequential operation cyclically.

3. A machine as in claim 1 wherein said shifting means is a pair of spaced tape-engageable pins carried by said knife and during overtravel of one of said knives said shifting means is arranged to displace a portion of the tape and severed excess lead portions held thereby.

4. A machine as in claim 1 wherein a lead locator having a pair of V-notches for positioning the respective leads of each component in alignment with the closed positions of two pairs of said fingers is provided, said locator being reciprocable transversely of the general plane containing said leads for engagement therewith just ahead of said knives.

5. A machine as in claim 1 and further comprising mechanism operable for adjusting the fingers and knives to accommodate variable center spacing of the leads to be engaged thereby.

6. A machine as in claim 1 wherein said fingers are arranged in pairs for acting on each lead, respectively, each pair including an inner and an outer finger, the inner fingers and the outer fingers being movable heightwise toward and from the board and also toward the leads to be inserted and away therefrom, said outer fingers being additionally movable toward the adjacent inner finger to close upon a lead just above the point it is to be severed by said knives in order thereafter to grip and guide the shorn leads while moving with the pusher toward the board and then separate from the leads during their further final insertion by the pusher.

7. A machine as in claims 1 or 2 wherein means is provided for indexing said means for feeding the tape-mounted components without requiring operation of the driver.

8. In a component inserting machine having means for successively feeding a tape and tape-carried components into alignment with the operating axis of a reciprocable pusher arranged to thrust the leads of the respectively aligned components into a circuit board, mechanism for yieldably actuating the pusher, a pair of shearing knives cooperatively movable for trimming excess portions from the leads of the aligned components adjacent to the tape, pairs of cooperative lead control fingers relatively movable heightwise and transversely of the axis and closeable to hold the leads individually as they are shorn by said knives and then guide the shorn leads endwise to said board before retracting from the axis, and means for shifting that portion of the tape holding the excess lead portions out of the path of the component to be inserted and the closed fingers guiding its leads.

9. An inserting machine as in claim 8 wherein the knives, said fingers, and said tape shifting means are all operatively connected to said pusher actuating mechanism.

10. An inserting machine as in claim 9 wherein the knives, fingers, and tape shifting mechanism are sequentially controlled cyclically by ball transfer means deriving motion from said pusher actuating mechanism.

11. An inserting machine as in claim 8 wherein the tape shifting mechanism comprises a pair of spaced pins mounted on one of said knives at opposite sides of said axis.

12. In a machine having means operable along an axis for inserting the radial leads of electrical components into spaced holes, respectively, of a circuit board, a pair of knives at least one of which is movable toward and from the other to cooperatively shear the leads to provide cut lead ends to be inserted in said holes, a lead locator movable toward and from said axis and adjacent to said movable knife, the locator having a leading edge formed with V-notches spaced to correspond with the centers of said holes, and means for causing the locator to engage the leads to be inserted just ahead of the shearing thereof by said knives whereby the notches position said cut ends in alignment with the respective hole centers.

13. A machine as in claim 12 wherein the locator is reciprocably mounted on said movable knife, and a spring engageable with the locator for yieldably urging its leading edge adhead of the shear edge of the movable knife.

14. A machine according to claims 12 or 13 having tape feeding means to position the components successively with respect to said axis, guide means for the tape permitting a portion thereof carrying the component next to be inserted to be displaced from alignment with said axis, and at least one member mounted on one of the knives for thus displacing said tape portion.

15. In a radial lead-type component inserting machine for inserting components carried by a continuous length of tape comprising means for indexing successive component bodies and their leads relative to an inserting axis and having a reciprocable driver, a pusher movable toward and from a circuit board into which the leads of the successive indexed component bodies are to be inserted and yieldably actuated by the driver and engageable with each indexed component body to urge it along the inserting axis and toward the board, sets of lead controlling fingers operatively connected to the driver and movable in the direction of the axis and relatively toward and from one another, mechanism operable by the driver for causing the finger sets respectively to close and grip a lead of an indexed component when they are adjacent to the axis and during their relative movement toward the board with the pusher, said mechanism being operable to release the gripped leads adjacent to the board and retract from the axis while the pusher continues therealong, and lead cutting means operable on the leads while seized by the fingers to remove excess end portions of the leads about to be inserted by the fingers and the pusher, and movable tape deflector means operable by the driver arranged to transversely displace the portion of the tape remaining after lead cutting.

16. A machine as in claim 15 wherein the lead cutting means comprises a pair of shearing knives cooperatively actuatable by connection to the driver, each set of fingers includes a normally open laterally closeable finger and a laterally fixed finger corresponding ends of which are formed with lead-clamping V-shaped walls, and mechanism actuatable by the driver for closing the movable fingers against indexed leads respectively engaged by the laterally fixed fingers during shearing of the leads by the knives, said finger closing mechanism being operative substantially until the sets of fingers contact a side of the board.

17. A machine as in claim 15 wherein the finger sets are adjustable apart to accommodate different leg spacings of the component leads.

18. In a machine for successively inserting radial leads of component bodies in a circuit board and including a head spaced above the board, means movably mounted in the head and operable along an axis for engaging each component body to urge its leads into the board, mechanism for operating said body engaging means cyclically, and means for presenting the successive components in substantial alignment with said axis in time relation to actuation of said mechanism, the improvement comprising:

at least two pairs of lead controlling fingers, means mounting said pairs in the head for joint movement in the direction of the axis along a path offset therefrom and toward and from the axis, means mounted in the head for relatively closing the finger pairs on the respective leads to be inserted thus to grip the leads and determine their respective positions relative to said axis and expose excess terminal portions of the leads, means for severing the excess lead portions comprising a pair of cooperating shears, at least one of which carries a lead locator for positioning a lead prior to its severance and actuating means for operating in sequence said body engaging means, the means for effecting said finger closures when said pairs are spaced from the board, the lead severing means, joint movement of the closed fingers and the body engaging means toward the board, and release of the fingers of each pair from the lead gripped thereby to permit further advance of the body engaging means and the severed leads toward the board.

19. A machine as in claim 18 wherein said actuating means includes ball transfer means operatively connected to said mechanism for operating the body engaging means.

* * * * *